United States Patent
Oberg et al.

(10) Patent No.: US 11,557,316 B2
(45) Date of Patent: Jan. 17, 2023

(54) PULSE-BASED WRITING FOR MAGNETIC STORAGE MEDIA

(71) Applicant: Marvell Asia Pte, Ltd., Singapore (SG)

(72) Inventors: Mats Oberg, San Jose, CA (US); Hao Fang, Eden Prarie, MN (US)

(73) Assignee: Marvell Asia PTE Ltd., Singapore (SG)

( * ) Notice: Subject to any disclaimer, the term of this patent is extended or adjusted under 35 U.S.C. 154(b) by 0 days.

(21) Appl. No.: 17/653,446

(22) Filed: Mar. 3, 2022

(65) Prior Publication Data

US 2022/0189504 A1 Jun. 16, 2022

Related U.S. Application Data

(63) Continuation of application No. 17/234,557, filed on Apr. 19, 2021, now Pat. No. 11,270,723, which is a
(Continued)

(51) Int. Cl.
*G11B 5/31* (2006.01)
*G11B 5/49* (2006.01)
*G11B 5/00* (2006.01)

(52) U.S. Cl.
CPC .......... *G11B 5/3116* (2013.01); *G11B 5/4923* (2013.01); *G11B 2005/0026* (2013.01); *G11B 2005/0032* (2013.01)

(58) Field of Classification Search
CPC ............... G11B 5/3116; G11B 5/4923; G11B 2005/0026; G11B 2005/0032; G11B 5/00;
(Continued)

(56) References Cited

U.S. PATENT DOCUMENTS 4,553,178 A 11/1985 Lynch
5,420,730 A 5/1995 Moon et al.
(Continued)

FOREIGN PATENT DOCUMENTS

CN 1122926 5/1996
CN 1166674 12/1997
(Continued)

OTHER PUBLICATIONS

"Foreign Office Action", CN Application No. 201910777843.5, dated Mar. 16, 2022, 8 pages.
(Continued)

*Primary Examiner* — Nabil Z Hindi

(57) ABSTRACT

The present disclosure describes aspects of pulse-based writing for magnetic storage media. In some aspects, a pulse-based writer of magnetic storage media determines that a string of data bits having a same polarity corresponds to a magnet longer than a threshold associated with a magnetic media writer. The pulse-based writer inserts, into the string of data bits, a transition to a polarity opposite to the same polarity of the string of data bits. The string of data bits including the inserted transition is then transmitted to the magnetic media writer to cause a write head of the writer to pulse while writing the magnet to magnetic storage media. Various aspects may also implement a control signal to mask a transition or control polarity of the magnetic media writer. By so doing, magnets may be written to the magnetic storage media more efficiently or with less distortion to neighboring tracks.

20 Claims, 16 Drawing Sheets

Related U.S. Application Data continuation of application No. 16/928,971, filed on Jul. 14, 2020, now Pat. No. 10,984,822, which is a continuation of application No. 16/545,966, filed on Aug. 20, 2019, now Pat. No. 10,734,016.

(60) Provisional application No. 62/720,791, filed on Aug. 21, 2018.

(58) Field of Classification Search
CPC ........... G11B 5/09; G11B 13/60; G11B 27/36; G11B 20/10007
USPC ...................................................... 360/40, 44
See application file for complete search history.

(56) References Cited

U.S. PATENT DOCUMENTS

| | | |
|---|---|---|
| 5,535,067 A | 7/1996 | Rooke |
| 5,636,075 A | 6/1997 | Nishimura et al. |
| 5,638,226 A * | 6/1997 | Koren ................ G11B 20/1426 360/65 |
| 6,023,386 A | 2/2000 | Reed et al. |
| 6,175,319 B1 | 1/2001 | Schneider et al. |
| 6,449,112 B1 | 9/2002 | Wursthorn et al. |
| 6,501,610 B1 | 12/2002 | Sugawara et al. |
| 6,574,754 B1 | 6/2003 | Smith |
| 6,658,201 B1 | 12/2003 | Rebalski |
| 7,236,911 B1 | 6/2007 | Gough et al. |
| 8,508,878 B1 | 8/2013 | Zou et al. |
| 8,508,879 B1 | 8/2013 | Zou et al. |
| 8,749,911 B1 | 6/2014 | Sun et al. |
| 8,792,197 B1 | 7/2014 | Wilson et al. |
| 8,873,181 B1 | 10/2014 | Zou et al. |
| 8,929,013 B1 | 1/2015 | Mastrocola et al. |
| 9,059,737 B2 | 6/2015 | Coker et al. |
| 9,281,009 B1 | 3/2016 | Burton et al. |
| 9,530,447 B2 | 12/2016 | Gao et al. |
| 10,068,609 B1 | 9/2018 | Mostafa et al. |
| 10,115,415 B1 | 10/2018 | Tang et al. |
| 10,276,198 B1 | 4/2019 | Katchmart et al. |
| 10,734,016 B2 | 8/2020 | Oberg et al. |
| 10,971,187 B2 | 4/2021 | Katchmart |
| 10,984,822 B2 | 4/2021 | Oberg et al. |
| 11,061,582 B2 | 7/2021 | Oberg |
| 11,270,723 B2 | 3/2022 | Oberg et al. |
| 11,450,348 B2 | 9/2022 | Nangare |
| 2003/0002187 A1 | 1/2003 | Ko et al. |
| 2004/0201913 A1 | 10/2004 | Sutardja |
| 2007/0159870 A1 | 7/2007 | Tanizaki et al. |
| 2007/0165320 A1 | 7/2007 | Benakli et al. |
| 2010/0241922 A1 | 9/2010 | Furuhashi et al. |
| 2011/0103210 A1 | 5/2011 | Kim et al. |
| 2013/0141818 A1 | 6/2013 | Sinclair et al. |
| 2014/0244926 A1 | 8/2014 | Yang et al. |
| 2014/0268396 A1 | 9/2014 | Shaver et al. |
| 2015/0062738 A1 | 3/2015 | Yang |
| 2015/0213813 A1 | 7/2015 | Lammers et al. |
| 2017/0270963 A1 | 9/2017 | Maeto |
| 2018/0060192 A1 | 3/2018 | Eggert et al. |
| 2018/0081571 A1 | 3/2018 | Akshara |
| 2018/0095665 A1 | 4/2018 | Xu et al. |
| 2019/0081571 A1 | 3/2019 | Chung et al. |
| 2020/0066299 A1 | 2/2020 | Oberg et al. |
| 2020/0202893 A1 | 6/2020 | Katchmart |
| 2020/0251143 A1 | 8/2020 | Nangare |
| 2020/0272339 A1 | 8/2020 | Oberg |
| 2020/0294549 A1 | 9/2020 | Katchmart |
| 2020/0342900 A1 | 10/2020 | Oberg et al. |
| 2021/0241789 A1 | 8/2021 | Oberg et al. |

FOREIGN PATENT DOCUMENTS

| | | |
|---|---|---|
| CN | 1286790 | 3/2001 |
| CN | 1347115 | 5/2002 |
| CN | 1354462 | 6/2002 |
| CN | 1750160 | 3/2006 |
| CN | 102129397 | 7/2011 |
| CN | 102800328 | 11/2012 |
| CN | 104932834 | 9/2015 |
| CN | 105719667 | 6/2016 |
| JP | S60185258 | 9/1985 |
| JP | H0628766 | 2/1994 |
| JP | H08287618 | 11/1996 |
| JP | 10255402 | 9/1998 |
| JP | 2001250292 | 9/2001 |
| JP | 2006031825 | 2/2006 |
| KR | 20010018400 | 3/2001 |
| WO | 2020174426 | 9/2020 |
| WO | 2020185792 | 9/2020 |

OTHER PUBLICATIONS

"Foreign Office Action", CN Application No. 202080016636.9, dated Mar. 21, 2022, 17 pages.

"Notice of Allowance", U.S. Appl. No. 16/737,174, filed May 13, 2022, 8 pages.

"Correceted Notice of Allowance", U.S. Appl. No. 16/812,960, dated Mar. 4, 2021, 2 pages.

"Extended European Search Report", EP Application No. 19192790.4, dated Jan. 3, 2020, 7 pages.

"Extended European Search Report", EP Application No. 20154549.8, dated Jul. 2, 2020, 6 pages.

"Foreign Office Action", EP Application No. 20154549.8, dated Jan. 4, 2022, 6 pages.

"Foreign Office Action", EP Application No. 19192790.4, dated Oct. 21, 2021, 5 pages.

"International Preliminary Report on Patentability", Application No. PCT/IB2020/051657, dated Aug. 25, 2021, 8 pages.

"International Preliminary Report on Patentability", Application No. PCT/US2020/021911, dated Dec. 3, 2020, 6 pages.

"International Search Report and Written Opinion", Application No. PCT/IB2020/051657, dated May 19, 2020, 14 pages.

"International Search Report and Written Opinion", Application No. PCT/US2020/021911, dated Jun. 2, 2020, 13 pages.

"Non-Final Office Action", U.S. Appl. No. 16/737,174, dated Feb. 4, 2022, 14 pages.

"Notice of Allowance", U.S. Appl. No. 16/545,966, dated Mar. 23, 2020, 7 Pages.

"Notice of Allowance", U.S. Appl. No. 16/801,506, dated Mar. 31, 2021, 8 pages.

"Notice of Allowance", U.S. Appl. No. 17/234,557, dated Nov. 1, 2021, 9 pages.

"Notice of Allowance", U.S. Appl. No. 16/812,960, dated Dec. 9, 2020, 5 pages.

"Notice of Allowance", U.S. Appl. No. 16/928,971, dated Dec. 16, 2020, 8 pages.

"Pre-Interview Communication", U.S. Appl. No. 16/812,960, dated Oct. 2, 2020, 7 pages.

"Run-Length Limited", URL: https://en.wikipedia.org/wiki/Run-length_limited, Oct. 18, 2019, 10 pages.

Xu, et al., "Health Status Assessment and Failure Prediction for Hard Drives with Recurrent Neural Networks", IEEE Transactions on Computers, vol. 65, No. 11, Nov. 2016, 7 pages.

"Foreign Office Action", CN Application No. 202080020304.8, dated Jul. 21, 2022, 9 pages.

"Foreign Office Action", CN Application No. 202010076783.7, dated Aug. 18, 2022, 30 pages.

"Foreign Office Action", KR Application No. 10-2019-0102593, dated Sep. 28, 2022, 10 pages.

"Foreign Office Action", CN Application No. 202080016636.9, dated Oct. 14, 2022, 5 pages.

* cited by examiner

1100

Determine a string of data bits having a same polarity corresponds to a magnet longer than a write head of a magnetic media writer
1102

Assert, in response to the determination, a signal useful to extend a pulse of write current for at least a portion of the magnet
1104

Maintain, via the magnetic media writer, at least a portion of the write current based on the signal and a length of the magnet
1106

Deassert, based on the length of the magnet, the signal to enable the write current to cease prior to a next pulse transition
1108

Fig. 11

PULSE-BASED WRITING FOR MAGNETIC STORAGE MEDIA

CROSS-REFERENCE TO RELATED APPLICATION

This application is a continuation of and claims priority to U.S. Utility patent application Ser. No. 17/234,557, filed Apr. 19, 2021, which in turn claims priority to U.S. Utility patent application Ser. No. 16/928,971, filed Jul. 14, 2020, which in turn claims priority to U.S. Utility patent application Ser. No. 16/545,966, filed Aug. 20, 2019, which in turn claims priority to U.S. Provisional Patent Application Ser. No. 62/720,791, filed Aug. 21, 2018, the disclosures of which are incorporated by reference herein in their entireties.

BACKGROUND

Electronic devices provide many services to modern society. These services enable an electronic device to provide entertainment, assist with scientific research and development, and provide many modern-day conveniences. Many of these services create or use data, which the electronic device stores. This data may include digital media such as books or movies, algorithms that execute complex simulations, personal user data, applications, and so forth. To avoid exceeding data storage limits, it is beneficial to increase the data storage capacity of the electronic device and avoid deleting data, limiting services, or purchasing additional external storage devices.

Many electronic devices use media drives to store data on disks, such as a hard-disk drive. Generally, the data of each disk is organized along concentric tracks of magnetic media in which individual bits of the data are written. To accommodate greater amounts of user data, data densities per media disk have increased substantially, shrinking physical geometries of both the tracks and bits written on the magnetic media. In some cases, track and bit sizes have shrunk such that a write head of a hard-disk drive is much larger than the individual data bits it writes on the magnetic media of the disk. The larger relative size of the write head can cause issues when writing magnets to the storage media, particularly when current of the write head ramps up and remains at a high level to write long magnets, such as for a string of consecutive ones or zeros. This not only consumes extra power to continuously or repeatedly overwrite magnet portions with a same polarity but can also degrade data bits of neighboring tracks with excess magnetic fields induced by the continuously applied write current.

SUMMARY

This summary is provided to introduce subject matter that is further described in the Detailed Description and Drawings. Accordingly, this Summary should not be considered to describe essential features nor used to limit the scope of the claimed subject matter.

In some aspects, a pulse-based writer of magnetic storage media implements a method that determines that a string of data bits having a same polarity corresponds to a magnet longer than a threshold associated with a magnetic media writer. The method includes inserting, into the string of data bits, at least one transition to a polarity opposite to the same polarity of the string of data bits. The method then transmits, to the magnetic media writer, the string of data bits including the at least one transition to cause a write head of the writer to pulse while writing the magnet corresponding to the string of bits. By so doing, the pulse-based writer may write magnets (e.g., long magnets) to the magnetic storage media more efficiently and with less degradation to data bits written on neighboring tracks of the magnetic storage media.

In other aspects, an apparatus comprises an interface to receive data from a host, a disk of magnetic storage media to store the data, a magnetic media writer configured to write the data to the magnetic storage media as data bits, and a pulse-based writer. The pulse-based writer is configured to determine that a string of the data bits having a same polarity corresponds to a magnet longer than a threshold associated with the magnetic media writer. The pulse-based writer inserts, into the string of the data bits, at least one transition to a polarity opposite to the same polarity of the string of the data bits. The string of the data bits, including the at least one transition, is transmitted by the pulse-based writer to the magnetic media writer to cause a write head of the writer to pulse while writing the magnet to the magnetic storage media of the disk.

In yet other aspects, a System-on-Chip (SoC) is described that includes an interface to a host from which data is received, an interface to a magnetic media writer of the magnetic storage media, and a pulse-based writer that is implemented at least partially in hardware. The pulse-based writer configured to determine that a string of data bits having a same polarity corresponds to a magnet longer than a threshold associated with the magnetic media writer. The pulse-based writer inserts, into the string of data bits, at least one transition to a polarity opposite to the same polarity of the string of data bits. The pulse-based writer then transmits, to the magnetic media writer, the string of data bits including the at least one transition to cause a write head of the magnetic media writer to pulse while writing the magnet to the magnetic storage media.

The details of one or more implementations are set forth in the accompanying drawings and the following description. Other features and advantages will be apparent from the description and drawings, and from the claims.

BRIEF DESCRIPTION OF THE DRAWINGS

The details of one or more implementations of pulse-based writing for magnetic storage media are set forth in the accompanying figures and the detailed description below. In the figures, the left-most digit of a reference number identifies the figure in which the reference number first appears. The use of the same reference numbers in different instances in the description and the figures indicates like elements:

FIG. 11 depicts an example method for relaxing write current of a magnetic media writer.

DETAILED DESCRIPTION

Figure 1:
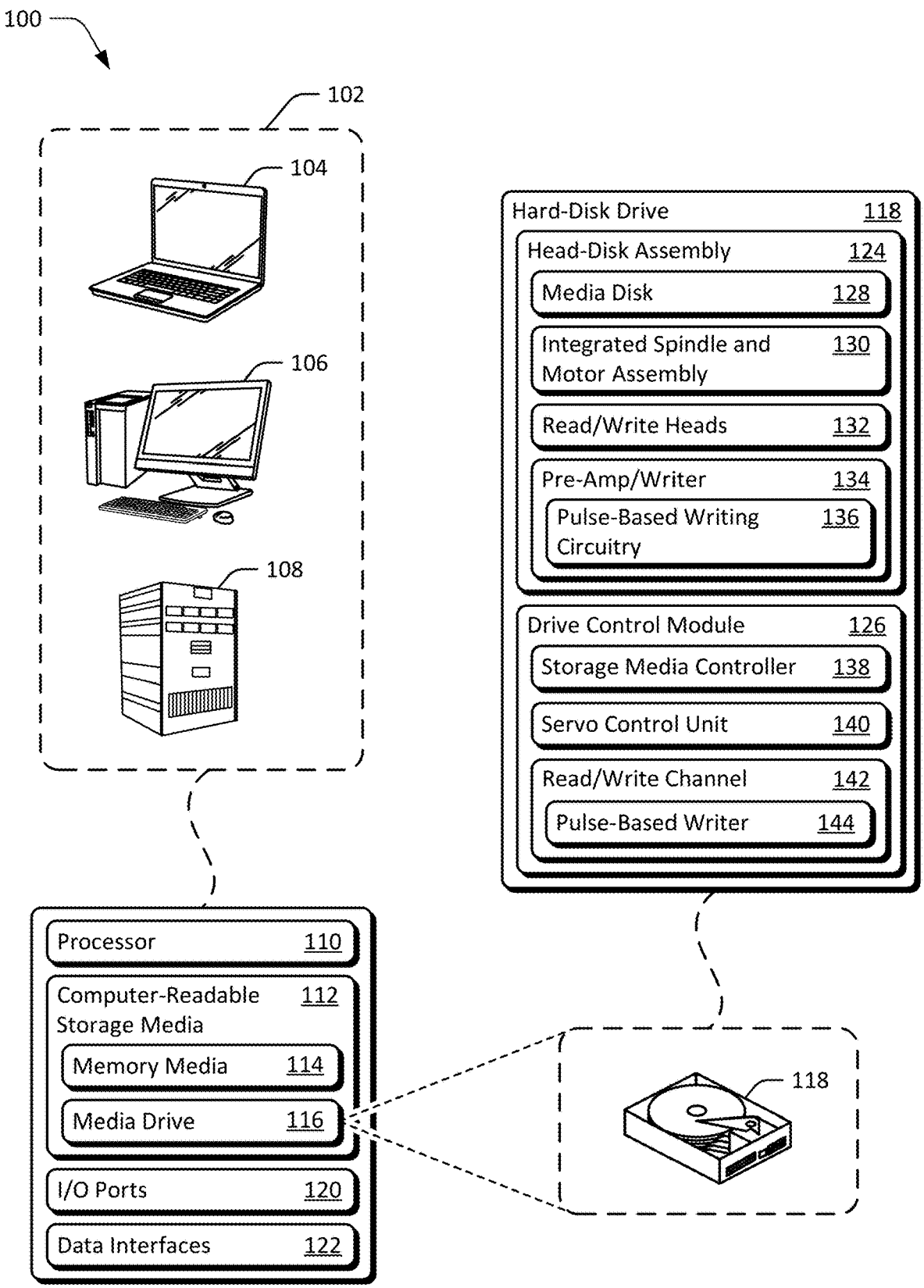
FIG. 1 illustrates an example operating environment having devices in which magnetic storage media is implemented in accordance with one or more aspects.

Conventional techniques for writing data to magnetic media of a disk often provide continuous current of one polarity or another to a write head by which the data is written to the magnetic media. Generally, the data of each disk is organized along concentric tracks of magnetic media in which individual bits of the data are written. As data densities per media disk have increased substantially, the physical geometries of both the tracks and bits written on the magnetic media have shrunk. With current drive technology, the write head of a hard-disk drive is typically much larger than the individual data bits it writes on the magnetic media of the disk. The larger relative size of the write head can cause issues when writing magnets to the storage media, particularly when the continuous current of the write head ramps up to one polarity and remains at a high level to write long magnets, such as for a string of consecutive ones or zeros. This not only consumes extra power to continuously or repeatedly overwrite magnet portions with a same polarity but can also degrade data bits of neighboring tracks with excess magnetic fields induced by the continuously applied write current.

This disclosure describes apparatuses and techniques of pulse-based writing for magnetic storage media. In contrast with conventional magnet writing techniques, the described apparatuses and techniques may implement pulse-based writing in which current of a magnetic media write head may be pulsed, such as based on bit transitions or control signals, to more efficiently write magnets or reduce distortion of data in neighboring tracks. For example, a magnetic media write head is typically longer than a length of an individual bit, e.g., linear density in magnetic recording is approaching 2500 kbpi (kilo-bits per inch), which means a size of an individual bit is on the order of 10 nanometers (10 nm). In contrast, a footprint or effective length of the write head may be significantly longer, e.g. 60 nm. Due to this difference in size, when the write head (media writer) has a particular magnetization polarity, it often magnetizes an area under the write head that corresponds to several data bits according to this polarity. In other words, the write head writes, during or in each bit period, the area of 4-6 consecutive bits with the one polarity as ones or zeros.

Because of this, aspects of pulse-based writing may permit the media writer to forgo or avoid providing additional magnetic field once the media has been magnetized to the desired polarity. As such, pulse-based writing for magnetic storage media may enable more efficient writing by reducing (e.g., relaxing) or turning off the write current provided to a write head. In various aspects of pulse-based writing, a pulse-based writer may provide write current to, or a magnetic field at, a write head for a short duration of time when a transition in the magnetic field is desired to alter a polarization of the magnetic media. For example, if a total length of consecutive bits having a same polarity exceeds a threshold or the length of the write head, then an additional pulse may be added or implemented at the write head to magnetize magnetic media that was not magnetized by the previous pulse (e.g., at a start of the consecutive bits).

With respect to write head geometry, the footprint of the write head may be on the order of 4-6 bits long, therefore able to write one bit (1T—T being a period of time to write a single bit magnet) or four bits (4T) with the same amount of current or effort. That is, once the first bit is written at the trailing edge of the write head, the write head has already written four bits (4T) of magnet or a longer magnet on the magnetic media under the write head. As such, a single pulse of write current is often sufficient to generate magnets of four to six bits (4T-6T) length and less. In other words, a single pulse of current or write field may be sufficient to write 4T and shorter magnets, with additional pulses enabling the writing of longer magnets. For example, providing a pulse of current or write field every 4T or 6T may enable the writing of longer magnets, such as for long strings of ones or zeroes in write data.

Generally, a read/write channel (or "read channel") of a magnetic media drive provides, to a pre-amplifier of the drive, a signal corresponding to a data pattern intended for writing on the media. The pre-amplifier (or pre-amp) circuit then generates or provides a write current to a write head of the media drive with a pattern of polarity corresponding to the data pattern. Based on the signal pattern provided by the read channel, the pre-amplifier changes the polarity of the write current that is sent to the write head. The pre-amplifier may also provide an overshoot current at or proximate to polarity changes to quicken a change of magnetic field of the write head. In aspects of pulse-based writing, a write mode may be enabled by which write current is provided as a pulse of current or over-shoot current on these transitions (or series of current pulses to write long or different polarity magnets).

In aspects of pulse-based writing, a pulse-based writer implemented with the read channel and/or pre-amp circuitry may manage the write current provided to a write head to implement pulse-based writing and/or current relaxation. In some cases, the pre-amp may effectively turn off the write current (e.g., $I_w$ or steady-state write current) after providing a pulse of overshoot write current (e.g., $I_w$+OSA or $I_w$ plus overshoot). To enable an aspect of pulse-based writing, pulsing away from transitions in a data pattern may be facilitated by injecting two transitions (e.g., fake transitions or a fake bit(s)) in signaling provided by the read channel to pre-amp, with an additional control signal to indicate to the pre-amp to inhibit or prevent pulsing when the control signal is active (e.g., high).

In other words, if the control signal is high, the pre-amp does not generate a write pulse, which enables the generation of multiple (e.g., periodic) pulses for long magnets. For example, for a first transition, the pulse-based writer may assert the control signal high (to prevent a pulse on the leading transition) and deassert the control signal low for the second transition to provide or generate a pulse of a same polarity of a preceding pulse (e.g., a pulse at a start of the magnet) at the second transition. Alternately or additionally, if the pre-amp is implemented with a memory, then consecutive pulses of a same polarity may have lower amplitude, and as such, the pre-amp would need to know its state (e.g., to compensate for the lower amplitude with overshoot).

Some aspects described in this disclosure may also include write current relaxation which may turn off or set write current to a pre-bias state (non-$I_w$ state). In some cases, the write current or magnetic field (write field) is turned off towards or proximate to the end of a long magnet written (e.g., consecutive bits written with a same polarity) to the magnetic storage media. For example, if 10 consecutive bits (10T) are written with the same polarity, then the magnetic field may be applied for a duration (or pulsed) for the first five or six bits (5T-6T), and then the write field may be relaxed or reduced to 0 or a pre-bias state (e.g., for a next transition). Because the full 10T of bits are written by the fifth or sixth bit, due to write head size, the write field is no longer needed to write the last four or five bits (4T-5T). By so doing, the magnetic media writer may be prepared (e.g., avoiding a full positive to negative write current swing) for a transition to opposite polarity, thus providing a faster or cleaner transition on a next magnet. Alternately or additionally, another benefit of write current relaxation and pulse-based writing is that the magnetic field is not applied when the magnetic field is not needed (e.g., for long magnets), and this may in turn reduce the effect the magnetic field has on previously written data on neighboring data tracks, such as reduced degradation or distortion.

In various aspects of pulse-based writing for magnetic storage media, a pulse-based writer may determine that a string of data bits having a same polarity corresponds to a magnet longer than a threshold associated with a magnetic media writer. The pulse-based writer inserts, into the string of data bits, a transition to a polarity opposite to the same polarity of the string of data bits. The string of data bits including the inserted transition is then transmitted to the magnetic media writer to cause a write head of the magnetic media writer to pulse while writing the magnet to magnetic storage media. Various aspects may also implement a control signal to mask a transition or provide an indication of signal polarity of the magnetic media writer. By so doing, the pulse-based writer may write magnets (e.g., long magnets or magnets that exceed write head dimensions) to the magnetic storage media more efficiently and with less degradation to data bits written on neighboring tracks.

The following discussion describes an operating environment, techniques that may be employed in the operating environment, and a System-on-Chip (SoC) in which components of the operating environment can be embodied. In the context of the present disclosure, reference is made to the operating environment by way of example only.

Operating Environment

FIG. 1 illustrates an example operating environment 100 having a computing device 102, capable of storing or accessing various forms of data or information. Examples of a computing device 102 may include a laptop computer 104, desktop computer 106, and server 108, any of which may be configured as part of a storage network or cloud storage. Further examples of a computing device 102 (not shown) may include a tablet computer, a set-top-box, a data storage appliance, wearable smart-device, television, content-streaming device, high-definition multimedia interface (HDMI) media stick, smart appliance, home automation controller, smart thermostat, Internet-of-Things (IoT) device, mobile-internet device (MID), a network-attached-storage (NAS) drive, aggregate storage system, gaming console, automotive entertainment device, automotive computing system, automotive control module (e.g., engine or power train control module), and so on.

Generally, the computing device 102 may provide, communicate, or store data for any suitable purpose, such as to enable functionalities of a particular type of device, provide a user interface, enable network access, implement gaming applications, playback media, provide navigation, edit content, provide data storage, or the like. Alternately or additionally, the computing device 102 is capable of storing various data, such as databases, user data, multimedia, applications, operating systems, and the like. One or more computing devices 102 may be configured to provide remote data storage or services, such as cloud storage, archiving, backup, client services, records retention, and so on.

The computing device 102 includes a processor 110 and computer-readable storage media 112. The processor 110 may be implemented as any suitable type or number of processors, either single-core or multi-core (e.g., ARM or x86 processor cores), for executing instructions or commands of an operating system or other programs of the computing device 102. The computer-readable storage media 112 (CRM 112) includes memory media 114 and a media drive 116. The memory media or system memory of the computing device 102 may include any suitable type or combination of volatile memory or nonvolatile memory. For example, volatile memory of the computing device 102 may include various types of random-access memory (RAM), dynamic RAM (DRAM), static RAM (SRAM) or the like. The non-volatile memory may include read-only memory (ROM), electronically erasable programmable ROM (EEPROM) or Flash memory (e.g., NOR Flash or NAND Flash). These memories, individually or in combination, may store data associated with applications and/or an operating system of computing device 102.

The media drive 116 of the computing device 102 may include one or more media drives or be implemented as part of a data storage system with which the computing device 102 is associated. In this example, the media drive 116 includes a hard-disk drive 118 (HDD 118), which is capable of storing data and is described with reference to various aspects of pulse-based writing. Alternately or additionally, the media drive 116 may be configured as any suitable type of data storage drive or system, such as a storage device, storage drive, storage array, storage volume, or the like. Although described with reference to the computing device 102, the media drive 116 may also be implemented separately as a standalone device or as part of a larger storage collective, such as a data center, server farm, or virtualized storage system (e.g., for cloud-based storage or services) in which aspects of pulse-based writing are implemented.

The computing device 102 may also include I/O ports 120, a graphics processing unit (GPU, not shown), and data interfaces 122. Generally, the I/O ports 120 allow a computing device 102 to interact with other devices, peripherals, or users. For example, the I/O ports 120 may include or be coupled with a universal serial bus, human interface devices, audio inputs, audio outputs, or the like. The GPU processes and renders graphics-related data for computing device 102, such as user interface elements of an operating system, applications, or the like. In some cases, the GPU accesses a portion of local memory to render graphics or includes dedicated memory for rendering graphics (e.g., video RAM) of the computing device 102.

The data interfaces 122 of the computing device 102 provide connectivity to one or more networks and other devices connected to those networks. The data interfaces 122 may include wired interfaces, such as Ethernet or fiber optic interfaces for data communicated over a local network, intranet, or the Internet. Alternately or additionally, the data interfaces 122 may include wireless interfaces that facilitate communication over wireless networks, such as wireless LANs, wide-area wireless networks (e.g., cellular networks), and/or wireless personal-area-networks (WPANs). Any of the data communicated through the I/O ports 120 or the data interfaces 122 may be written to or read from the storage system of the computing device 102 in accordance with one or more aspects of pulse-based writing for magnetic storage media.

Returning to the media drive 116, the computing device 102 may include the hard-disk drive 118 as shown and/or other types of storage media on which pulse-based writing may be implemented. Although not shown, other configurations of the media drive 116 are also contemplated, such as a solid-state drive (SSD), a magnetic tape drive, optical media drives, HDD/SSD hybrid drives, and other storage systems that write data to storage media (e.g., magnetic or optical storage media). Alternately or additionally, the computing device 102 may include an array of media drives or serve as a media drive aggregation device or host for multiple media drives in which aspects of pulse-based writing may be implemented.

In this example, the disk drive 118 includes a head-disk assembly 124 (HDA 124) and drive control module 126 to implement or enable functionalities of the hard-disk drive 118. In some cases, the drive control module 126 is implemented as a printed circuit board assembly (PCBA) with semiconductor devices, logic, or other circuitry. The HDA 124 includes one or more media disks 128 mounted on an integrated spindle and motor assembly 130. The spindle and motor assembly 130 may rotate the media disk 128 under (or over) read/write heads 132 coupled with a head assembly (not shown) of the HDA 124. The media disks 128 may be coated with a magnetically hard material (e.g., a particulate surface or a thin-film surface) and may be written to, or read from, a single side or both sides.

The read/write heads 132 may be operably coupled with a pre-amplifier/writer module 134 (pre-amp/writer 134) of the HDA 124 that includes pre-amplifier circuitry and an instance of pulse-based writing circuitry 136. The pre-amp/writer 134 may receive or store head selection, amplification, or sense current values useful for writing data to, or reading data from, the magnetic media 202. The pulse-based writing circuitry 136 may be configured to function in concert or coordination with other components of the hard-disk-drive 118 to implement aspects of pulse-based writing. How the pulse-based writing circuitry 136 is implemented and used varies and is described throughout this disclosure.

As shown in FIG. 1, the example drive control module 126 of the hard-disk drive 118 may include a storage media controller 138, a servo control unit 140, and a read/write channel 142 (R/W channel 142). In some aspects, the read/write channel 142 includes a pulse-based writer 144 to generate, manage, or alter various signals or data (e.g., encoded bit stream) to implement features of pulse-based writing for magnetic storage media. How the pulse-based writer 144 is implemented and used varies and is described throughout this disclosure. Generally, the drive control module 126 may direct or use the servo control unit 140 to control mechanical operations, such as read/write head 132 positioning through the HDA 124 and rotational speed control through the spindle and motor assembly 130. The drive control module 126 or components thereof may be implemented as one or more IC chips, a System-on-Chip, a System-in-Package, or a microprocessor provided with or implementing a hard-disk-drive controller. The drive control module 126 may also include drive electronics (not shown) and/or include various interfaces, such as a host-bus interface, storage media interface, spindle interface, or a pre-amp/writer interface.

Figure 2:
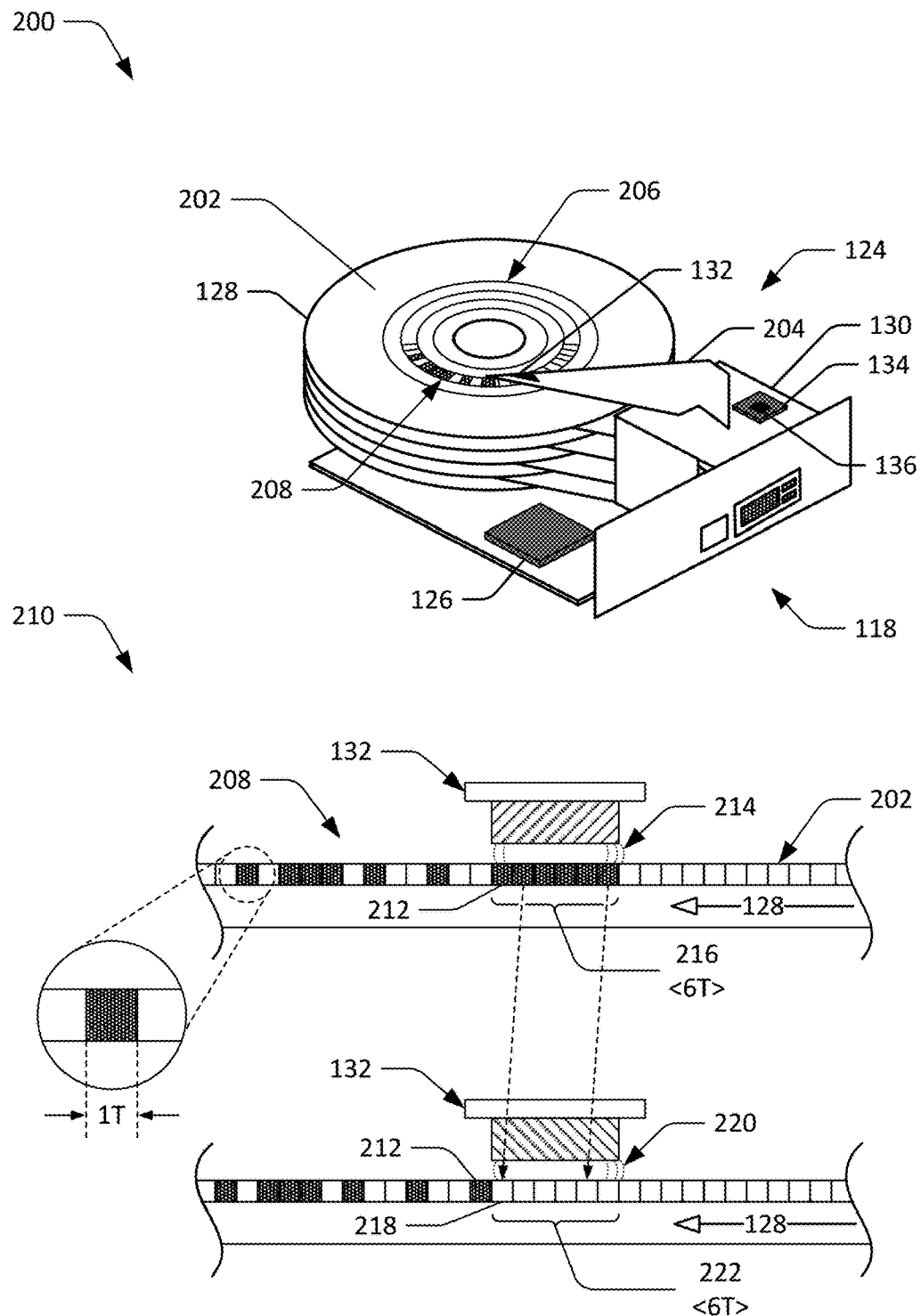
FIG. 2 illustrates an example configuration of the hard-disk drive shown in FIG. 1.

By way of example, consider FIG. 2 which provides an example configuration of the hard-disk drive 118, illustrated generally at 200. As shown in FIG. 2, the HDA 124 of the hard-disk drive 118 includes an integrated spindle and motor assembly 130 by which media disks 128 of magnetic media 202 are supported and/or operated. An arm 204 may maneuver, and thus position a read/write head 132 (or multiple read/write heads 132) over a desired track 206 of the magnetic media 202 on the media disk 128. In various aspects, the read/write head 132 may include various numbers of head elements with combined or separate functions (e.g., dedicated R/W functions). For example, the read/write head 132 may include one or more readers (read heads/elements) and one writer (write head/element). In other cases, the read/write head 132 may include a dedicated write head (element) and one or more separate, additional dedicated read heads (elements). Alternately or additionally, although multiple arms 204 are shown in FIG. 2, the HDA 124 or spindle and motor assembly may be implemented with a single arm 204 or other suitable structures for positing the read/write head 132. The HDA 124 and the drive control module 126 may be implemented separately, on separate substrates, and/or as separate PCBAs of a media drive. Signals or data communicated between the HDA 124 and the drive control module 126 may be carried through a flexible printed cable or other suitable connective structures, such as traces, connectors, bond wires, solder balls, or the like.

FIG. 2 also includes an illustration of example magnets 208 written to the magnetic media 202 of a media disk 128. One or more of the read/write heads 132 may write magnets to respective ones of the tracks 206 of a media disk 128, where sectors are provided for each of the tracks (e.g., a sector of tracks 206). For illustrative purposes, a top media disk 128 is shown to include tracks 206, for example, after being written with magnets 208 by a read/write head 132. Generally, during write operations, the read/write head 132 may be driven by a write current provided by the pre-amp/writer 134, whereby an electrical signal is used to generate and/or transfer magnetic fields having associated polarities to the media disk 128. In response to application of the magnetic fields or write fields, the read/write head 132 may form a plurality of magnets 208 in magnetic grains of the tracks 206 of the media disk 128. The HDA 124 of the hard-disk drive 118 may be configured to perform write operations in accordance with any suitable recording technology, such as perpendicular magnetic recording (PMR), shingled magnetic recording (SMR), heat-assisted magnetic recording (HAMR), microwave assisted magnetic recording (MAMR), or the like.

As shown at 210, a write head 132 (or read/write head 132 when combined) may write, generate, or polarize one or more magnets in the magnetic media 202 under the write head 132. With respect to write head geometry, assume that the write head 132 is approximately as long, either physically or equivalently through an effective magnetic field, as 6 magnets or 6T (magnet periods or magnetic write periods).

In this example and in accordance with aspects of pulse-based writing, the pre-amp/writer 134 writes a magnet 212 with a first polarity (shaded), which may correspond to a first bit encoding (e.g., negative transition, encoding a "0", or zero (0) value). To write the magnet 212, the pre-amp/writer 134 provides a first pulse of write current having a first polarity to the write head 132 to generate a first magnetic field 214 to generate or form the magnet 212. Note that the first magnetic field 214 writes, based on the first pulse of write current, not only magnet 212 but the following five magnets 216 with the same polarity.

As shown during the next bit writing period (T+1), the pre-amp/writer 134 writes a magnet 218 with a second polarity (non-shaded), which may correspond to a second bit encoding (e.g., positive transition, encoding a "1", or one (1) value). To write magnet 218, the pre-amp/writer 134 provides a second pulse of write current having a second polarity to the write head 132 to generate a second magnetic field 220 to generate or form the magnet 218. Here, note that the second magnetic field 220 writes, based on the second pulse of write current, not only magnet 218 but the following five magnets 222 with the same polarity. In other words, in aspects of pulse-based writing, once the first bit is written at the trailing edge of the write head 132, the write head has already written six bits (6T) of magnet or a longer magnet on the magnetic media under the write head. As such, a single pulse of write current is often sufficient to generate magnets of four to six bits (4T-6T) length and less. Thus, a single pulse of current or write field is sufficient to write 4T and shorter magnets, with additional pulses enabling the writing of longer magnets. In aspects of pulse-based writing, providing a pulse of current or write field every 4T or 6T may enable the writing of longer magnets, such as for long strings of ones or zeroes more efficiently or with less distortion to data of neighboring tracks.

Figure 3:
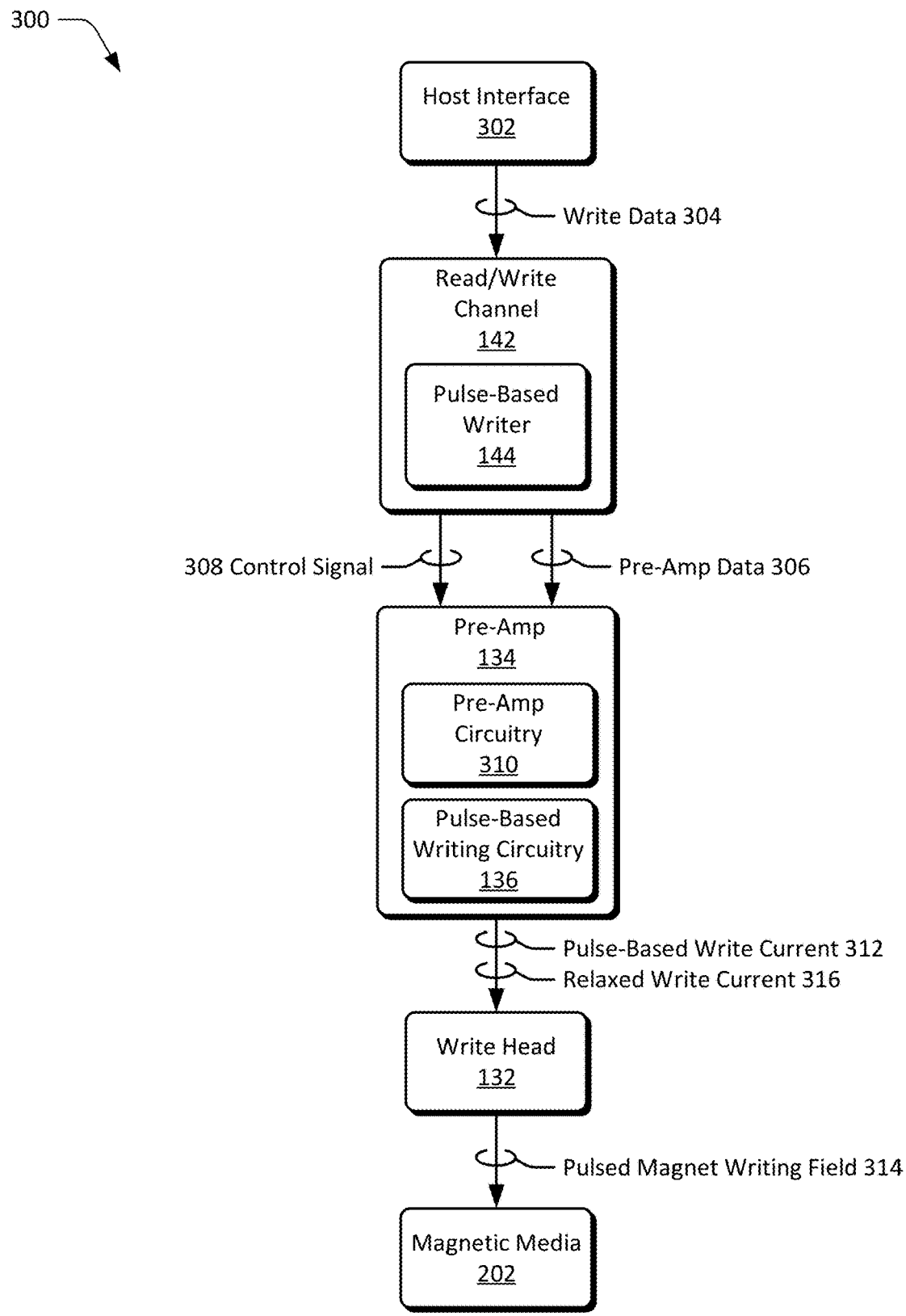
FIG. 3 illustrates example configurations of a read/write channel and pre-amplifier in accordance with one or more aspects of pulse-based writing.

FIG. 3 illustrates example configurations of a read/write channel and pre-amplifier generally at 300, which are implemented in accordance with one or more aspects of pulse-based writing for magnetic storage media. In this example, the pulse-based writer 144 is operably coupled with the read/write channel 142 and the pulse-based writing circuitry 136 is operably coupled with the pre-amp/writer 134 (pre-amp 134). Although shown in FIG. 3 as separate components or circuitry, the pulse-based writer 144 and pulse-based writing circuitry 136 may be integrated as one component, separated among other components of the hard-disk drive 118, and/or integrated with other microelectronics or circuitry of the pre-amp 134 and/or the read/write channel 142.

In this example, a host interface 302 provides write data 304 or other information to the read/write channel 142 or a storage media controller on which the read/write channel 142 is embodied. Generally, the read/write channel 142 provides, to the pre-amp 134 of a media drive, pre-amp data 306, which may include a signal corresponding to a data pattern intended for writing on the media. In aspects of pulse-based writing, the pulse-based writer 144 may alter the pre-amp data 306 sent to the pre-amp 134, such as by inserting transitions, altering bit polarities, inserting fake bits, or any combination of the like. The pulse-based writer 144 may also generate or cause the read/write channel to generate a control signal 308 for the pre-amp 134. In some cases, the pulse-based writer 144 may generate a control signal 308 to mask transitions, inhibit or prevent pulsing by the pre-amp 134, or to control or provide an indication of polarity or a state of polarity modification (e.g., for pre-amp data 306 signals).

For example, in some aspects of pulse-based writing, pulsing away from transitions in a data pattern may be facilitated by the pulse-based writer 144 injecting two transitions in signaling (pre-amp data 306) provided by the read/write channel 142 to the pre-amp 134, with an additional control signal (control signal 308) to indicate to the pre-amp 134 to inhibit or prevent pulsing when the control signal is active (e.g., high). In other words, if the control signal is high, the pre-amp 134 does not generate a write pulse, which enables the generation of multiple (e.g., periodic and/or of same polarity) pulses for long magnets. For example, for a first transition, the pulse-based writer 144 may assert the control signal 308 high and deassert the control signal low for the second transition to provide or generate a pulse of a same polarity of a preceding pulse (e.g., a pulse at a start of the magnet) at the second transition.

Generally, the pre-amp 134 or pre-amp circuitry 310 generates or provides a write current to the write head 132 of the media drive with the pattern of polarity or transitions corresponding to the pre-amp data 306 (modified or not) and/or control signal 308 for pulse-based writing. Based on the data and/or control signals pattern provided by the read/write channel 142 and pulse-based writer 144, the pre-amp 134 may generate pulses, or change polarity of, the write current that is sent to the write head 132. As described herein, the pre-amp 134 may also provide an overshoot current at, or proximate, polarity changes to quicken a change of magnetic field of the write head. Alternately or additionally, the pre-amp circuitry 310 may also implement other write controls, such as an overshoot level adjustment, overshoot duration, write-current baseline level, rise/fall speeds for pulse-writing transitions, or the like.

The write current generated by the pre-amp 134, or a pulse-based write current 312 as shown in FIG. 3, may be provided to a corresponding write head 132 for the magnetic media 202. Based on the pulse-based current 312, the write head 132 may generate a pulsed magnet writing field 314 to form magnets that correspond to the pre-amp data 306 or any suitable form of signaling or encoding for data received from the host interface 302. For example, the pulsed magnet writing field 314 pulse on transitions of pre-amp data bits to write or form respective magnets of corresponding polarity in the magnetic media 202. In various aspects, the pre-amp 134 may cause or generate the pulsed magnet writing field 314 to write long magnets with multiple pulses that form or polarize respective sections (e.g., multiple bits) of a long magnets, such as 4T or 5T sections.

In some aspects, the pulse-based writer 144 may also implement write current relaxation, which may turn off or set write current to a pre-bias state (non-$I_w$ state). In some cases, the pulse-based writer 144 turns off the write current or magnetic field (write field) towards or proximate to an end of a long magnet written (e.g., consecutive bits written with a same polarity) to the magnetic storage media. By so doing, the read/write channel 142 and/or pre-amp 134 may be prepared (e.g., avoiding a full positive to negative write current swing) for a transition of the write current or pulse to opposite polarity, thus providing a faster or cleaner transition on a next magnet. For example, the pulse-based writer 144 may cause the pre-amp 134 or pulse-based writing circuitry 136 to provide relaxed write current 316 and/or pulse-based write current 312 to the write head 132 in accordance with various aspects described herein. In some cases, a benefit of write current relaxation or pulse-based writing implemented by the pulse-based writer 144 may include that the magnetic field is not applied when the magnetic field is not needed (e.g., for long magnets), and this may in turn reduce an effect the magnetic field has on previously written data on neighboring data tracks, such as reduced degradation or distortion.

Techniques of Pulse-Based Writing for Magnetic Storage Media

The following discussion describes techniques of pulse-based writing for magnetic storage media, which may improve writing efficiency or reduce distortion of previously written data in neighboring tracks. These techniques may be implemented using any of the environments and entities described herein, such as the pre-amp/writer 134, pulse-based writing circuitry 136, read/write channel 142, or pulse-based writer 144. These techniques include methods illustrated in FIGS. 4, 7, 9, 11, and 13, each of which is shown as a set of operations performed by one or more entities.

These methods are not necessarily limited to the orders of operations shown in the associated figures. Rather, any of the operations may be repeated, skipped, substituted, or re-ordered to implement various aspects described herein. Further, these methods may be used in conjunction with one another, in whole or in part, whether performed by the same entity, separate entities, or any combination thereof. For example, aspects of the methods described may be combined to implement pulse-based writing for magnetic media with a combination of injected transitions, transition masking, polarity control, modified pre-amp data, and/or write current relaxation. In portions of the following discussion, reference will be made to the operating environment 100 of FIG. 1, entities of FIG. 2 and/or FIG. 3. Such reference is not to be taken as limiting described aspects to the operating environment 100, entities, configurations, or implementations, but rather as illustrative of one of a variety of examples. Alternately or additionally, operations of the methods may also be implemented by or with entities described with reference to the System-on-Chip of FIG. 15 and/or the storage media controller of FIG. 16.

Figure 4:
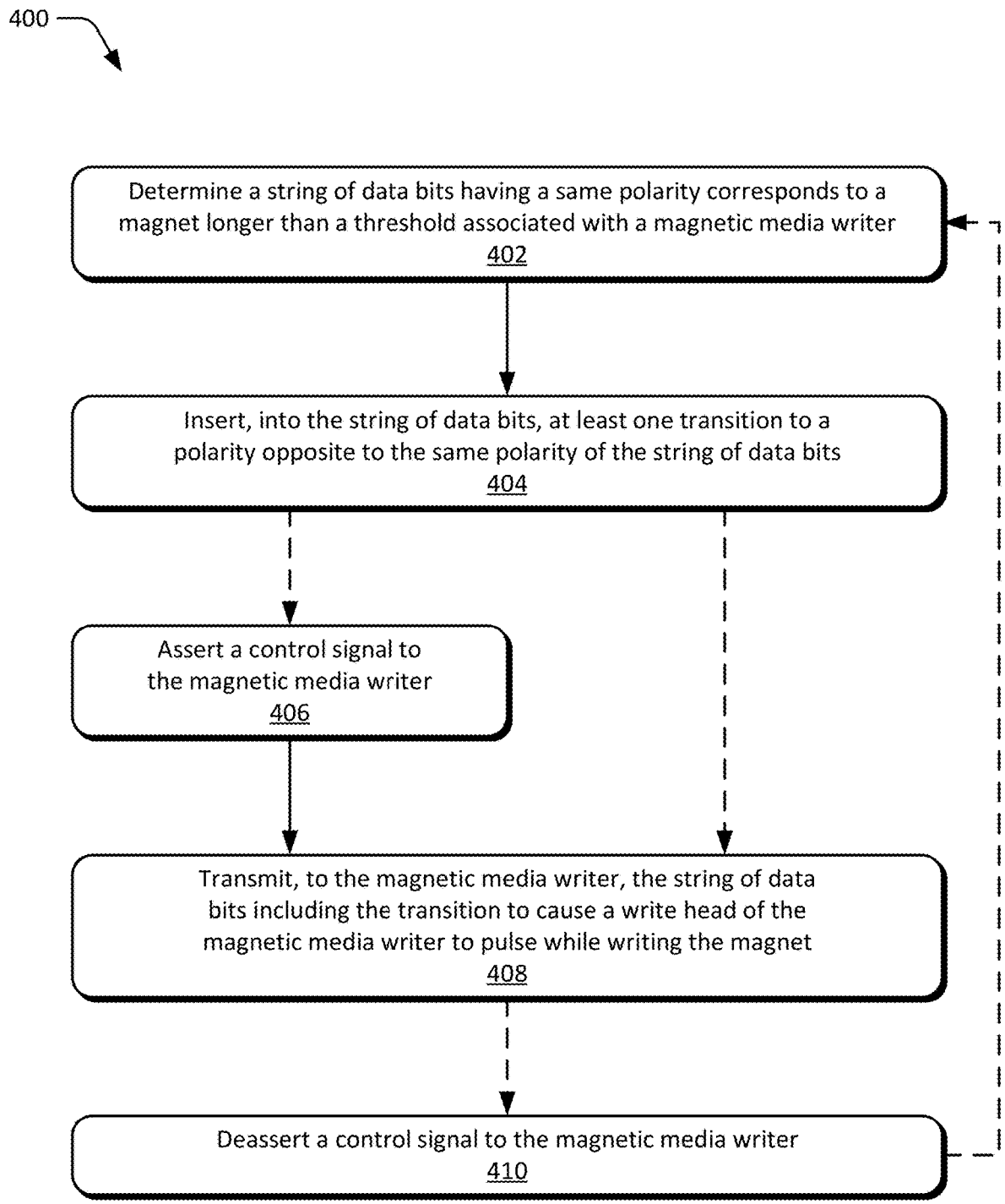
FIG. 4 depicts an example method for implementing pulse-based writing for magnetic storage media in accordance with one or more aspects.

FIG. 4 depicts an example method 400 for implementing pulse-based writing of magnetic storage media, including operations performed by or with the pulse-based writing circuitry 136, read/write channel 142, and/or pulse-based writer 144.

At 402, a pulse-based writer determines that a string of data bits having a same polarity corresponds to a magnet longer than a threshold associated with a magnetic media writer. The threshold may correspond with or be based on a geometry of a write head of the magnetic media writer, such as approximately a length of the write head or one or more bits shorter (e.g., 4T for a 5T long write head). In some cases, a number of consecutive bits of the same polarity are compared with a predefined threshold. As described herein, the predefined threshold may be defined based on the geometry of the write head or the geometry of magnets that are written to the magnetic storage media. In such cases, the predefined threshold may correspond to an approximate length or an effective length of the write head with respect to a length of the magnets. For example, the predefined threshold may be set to enable determinations or detections of magnets that meet or exceed four to six bit periods or magnet periods (e.g., 4T, 5T, or 6T).

At 404, the pulse-based writer inserts, into the string of data bits, at least one transition to a polarity opposite to the polarity of the string of data bits. In some cases, the pulse-based writer inserts pairs of fake transitions or bits that are effective to cause the magnetic media writer to generate pulses of write current. In some cases, a first transition and a second transition are inserted into the string of data bits or a signal representing or encoding the string of data bits, such as a non-return-to-zero (NRZ) encoded data signal or into a pre-amp data waveform. A polarity of the first transition is opposite to the polarity of the second transition. For example, a pair of transitions may be inserted into the string of bits as a 1T or 2T bit having an opposite polarity. Alternately or additionally, the first transition and the second transition may be consecutive transitions in the signal of the data bits that are inserted with approximately one bit, two bits, one magnet period (1T), or two magnet periods (2T) of separation.

Optionally at 406, the pulse-based writer asserts a control signal to the magnetic media writer. Alternately or additionally, the pulse-based writer may deassert or change a state of the control signal or a control line to cause the magnetic media writer (e.g., pulse-based writing circuitry of the writer) to act in accordance with aspects of pulse-based writing or to provide an indication to the magnetic media writer. In some cases, a control signal (or other logical indication) to the magnetic media writer may be effective to mask at least one transition inserted into the data bits or data signal. In other cases, the control signal may indicate, to the magnetic media writer, a polarity of the string of data bits that corresponds to the magnet or a polarity of a subsequent string of data bits. In such cases, the control signal may cause the magnetic media writer to pulse the write current provided to the write head in a polarity opposite to the polarity of a transition inserted into the string of data bits.

At 408, the pulse-based writer transmits, to the magnetic media writer, the string of data bits including the transition causing the write head to pulse while writing the magnet to the magnetic media. In some aspects, one of the transitions or the control signal may cause the magnetic media writer to generate or provide a pulse of write current to the write head. One or more pulses of write current, provided after an initial pulse at a start of a magnet, may enable the pulse-based writer to write long magnets more efficiently or with minimal distortion of data in neighboring tracks (e.g., to the track being written with pulse-based writing).

Optionally at 410, the pulse-based writer deasserts the control signal to the magnetic media writer. In some cases, the control signal may be deasserted proximate to an end of a long magnet to allow write current to relax or settle before a next transition or to pulse toward an opposite polarity. For example, the pulse-based writer may determine that at least a portion of subsequent data bits have the same polarity and correspond to another magnet longer than the write head of the magnetic media writer. In response to an upcoming transition or another long magnet, the control signal may be deasserted. From operation 410, the method 400 may return to operation 402 to implement another iteration of method 400, or to any other operation implementing aspects of pulse-based writing, such as providing multiple pulses during a long magnet.

Figure 5:
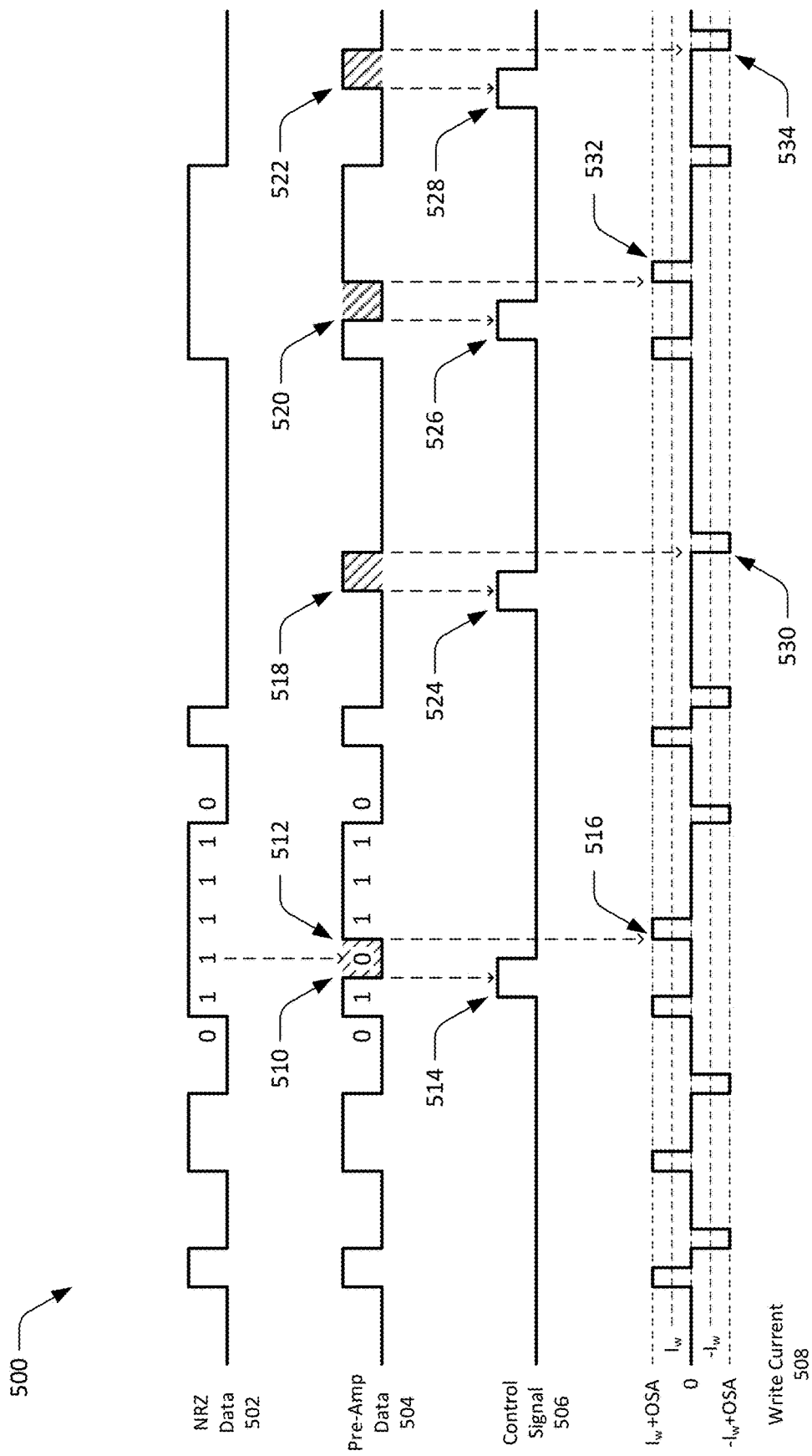
FIG. 5 illustrates an example graph of pre-amp data that includes transitions in accordance with one or more aspects.

By way of example, consider FIG. 5 which illustrates at 500 an example graph of pre-amp data that includes transitions in accordance with various aspects of pulse-based writing. The graphs or waveforms of FIG. 5 include NRZ data 502, pre-amp data 504, a control signal 506, and write current 508. Generally, the NRZ data 502 may be provided to or encoded by a read/write channel 142. In some aspects, a pulse-based writer 144 alters or modifies the NRZ data 502 to provide the pre-amp data 504 for a pre-amp/writer 134 or pre-amplifier circuitry 310. Alternately or additionally, the pulse-based writer 144 may generate or set the control signal 506 to the pre-amp/writer 134 or pre-amplifier circuitry 310 (or pulse-based writing circuitry 136). In various aspects, based on the pre-amp data 504 and/or control signal 506, the pre-amp/writer 134 or pre-amplifier circuitry 310 generates pulses of write current 508 to form or write magnets to magnetic storage media.

In some aspects, the NRZ data 502 (or NRZ signal) may represent a sequence of digital bits, or a data pattern, to be encoded on the magnetic storage or recording medium. Alternately or additionally, the NRZ data may be implemented as non-return-to-zero inverted (NRZi) for encoding data bits and may be based on a read/write channel configuration or the polarity of pre-amp circuitry. With reference to the graphs depicted in this and other figures (e.g., FIG. 6, 8, 10, or 12), the NRZ data may be shown as a binary signal having a rectangular pulse-amplitude modulation with levels associated with negative (−) and positive (+) polarities. Generally, transitions to an alternate level (or an absence of a transition) of the NRZ data 502 during a window or bit period may represent an individual coded bit. As shown in FIG. 5, the NRZ data 502 has an amplitude that alternates between a high level (+ polarity) and a low level (− polarity). Moreover, the NRZ data 502 has multiple transitions, as the signal rises or falls to reach an alternate polarity level. As an example, the NRZ data 502 may represent a "1" at rising edges, where the signal transitions from a low to a high level. Additionally, the NRZ data 502 may represent a "0" at falling edges, where the signal drops from the high level to the lower level, examples of which are provided in FIG. 5 and other figures for convenient reference.

The NRZ data 502 may be provided to or generated by the read/write channel 142, which in turn provides the pre-amp data 504 to the pre-amp 134. In some aspects, the read/write channel 142 or the pulse-based writer 144 alters or modifies the NRZ data 502 to provide the pre-amp data 504 to enable pulse-based writing for the magnetic storage media. Based on the pre-amp data 504, control signal 506, and/or other various settings, the pre-amp 134 generates or controls the write current 508. As shown in FIG. 5, the write current 508 may include multiple step-waves that generally begin with an overshoot at a polar transition (e.g., edge of the NRZ data 502). The overshoot amplitude (OSA) may be described as a substantially increased (or spike) level for the write current 508. By starting with an increased current, as produced by the overshoot amplitude, the pre-amp/writer 134 may change the polarities of the magnetic fields faster, thereby ensuring that the writer is set to the proper state needed for a sharp transition in the encoded data. After the initial overshoot, the amplitude of the write current 508 may settle to a more stable baseline current level for the remainder of the magnet writing duration. As such, an increased overshoot amplitude may enable the pre-amp/writer 134 to compensate for writing higher frequency data patterns with a lower speed write head.

As shown in FIG. 5, the write current 508 amplitude may be selectively set to at least five levels. The write current 508 graph includes a zero level or off state, a write current baseline ($I_w$), a write current with overshoot amplitude ($I_w$+OSA), a negative write current baseline (−$I_w$), and a negative write current with overshoot amplitude (−$I_w$+OSA). Alternately or additionally, the pre-amp/writer 134 may be configurable to provide a pre-bias level that is slightly positive or negative for aiding in transitions of the write current 508. For example, in some aspects of pulse-based writing or current relaxation, the pre-amp/writer 134 may transition from a positive write current to a negative pre-bias state in anticipation of a negative pulse of the write current (or vice versa).

Generally, the pulse-based writer 144, read/write channel 142, and/or the pre-amp/writer 134 may determine or select an amplitude of the write current 508. For example, the pulse-based writer 144 may select an overshoot amplitude for pulsing the write current on a transition, a baseline write current while writing another section of a magnet (e.g., intermediate section of a long magnet), and an off-state or pre-bias condition for the write current before the next transition or pulse to a different polarity (e.g., for write current relaxation at a tail end of a long magnet). How the pulse-based writer 144 implements write current pulses or control varies and is described throughout the disclosure.

In this example, the pulse-based writer 144 of the read/write channel 142 may be configured to insert pairs of fake transitions into an NRZ or NRZi data path for various magnets or magnets that exceed a geometry of a write head, such as 5T or longer magnets. The pulse-based writer is also configured to use the control signal 506 to inhibit or prevent pulses on a first or leading transition of the pair of transitions. As shown in FIG. 5, the pulse-based writer 144 may insert a pair of fake transitions 510 and 512 to modify or alter the pre-amp data 504. In other words, a 5T magnet (0111110) may be modified as or to mimic a 1T1T3T magnet in the pre-amp data 504.

In some cases, the pulse-based writer 144 also asserts or generates a control signal at 514 to mask the leading fake transition 510 causing the write current 508 to pulse at 516 with the same direction as the previous pulse at the start of the magnet. In other words, when the control signal 506 is high or asserted, the pre-amp/writer 134 or pulse-writing circuitry 136 may be inhibited or prevented from outputting a pulse of write current. The pulse-based writer 144 may also insert fake transitions in the NRZ data 502 that correspond to respective long magnets as shown at 518, 520, and/or 522. As shown in FIG. 5, the pulse-based writer 144 also asserts the control signal 506 at 524, 526, and 528 to prevent the pre-amp/writer 134 from pulsing on the leading fake transition to provide the pulses of write current shown at 530, 532, and 534.

The read/write channel 142 or the pulse-based writer 144 may be implemented through any suitable combination of logic, circuitry, or software executed by a hardware-based processor to implement aspects of pulse-based writing. In some cases, aspects of method 400 and/or signal waveforms of FIG. 5 may be implemented through the logic of Table 1 in which:

TABLE 1

Logic for transitions on an NRZi path for pre-amp data

| Pulse_3T_EN | Control Signal |
|---|---|
| 0 | $w_i$ = ! ($w_{i-2}$\|$w_{i-1}$\|$v_{i-1}$\|$v_i$\|$v_{i+1}$\|$v_{i+2}$)&($v_{i+3}$ \|! ($v_{i-2}$\|$w_{i-3}$)) |
| 1 | $w_i$ = ! ($w_{i-1}$\|$v_i$\|$v_{i+1}$\|$v_{i+2}$)&($v_{i+3}$ \|! ($v_{i-1}$\|$w_{i-2}$)) |

$v_i$ denotes NRZi bit at time i
$v'_i$ denotes NRZi sequence sent to preamp ($v'_i$ = $v_i$ + $w_i$ + $w_{i-1}$, + denotes XOR)
$w_i$ denotes Control signal at time i By pulsing the write current 508 as shown in FIG. 5, the pulse-based writer 144 may enable the formation of magnets in magnetic media more efficiently or with less distortion to the data in neighboring tracks.

Figure 6:
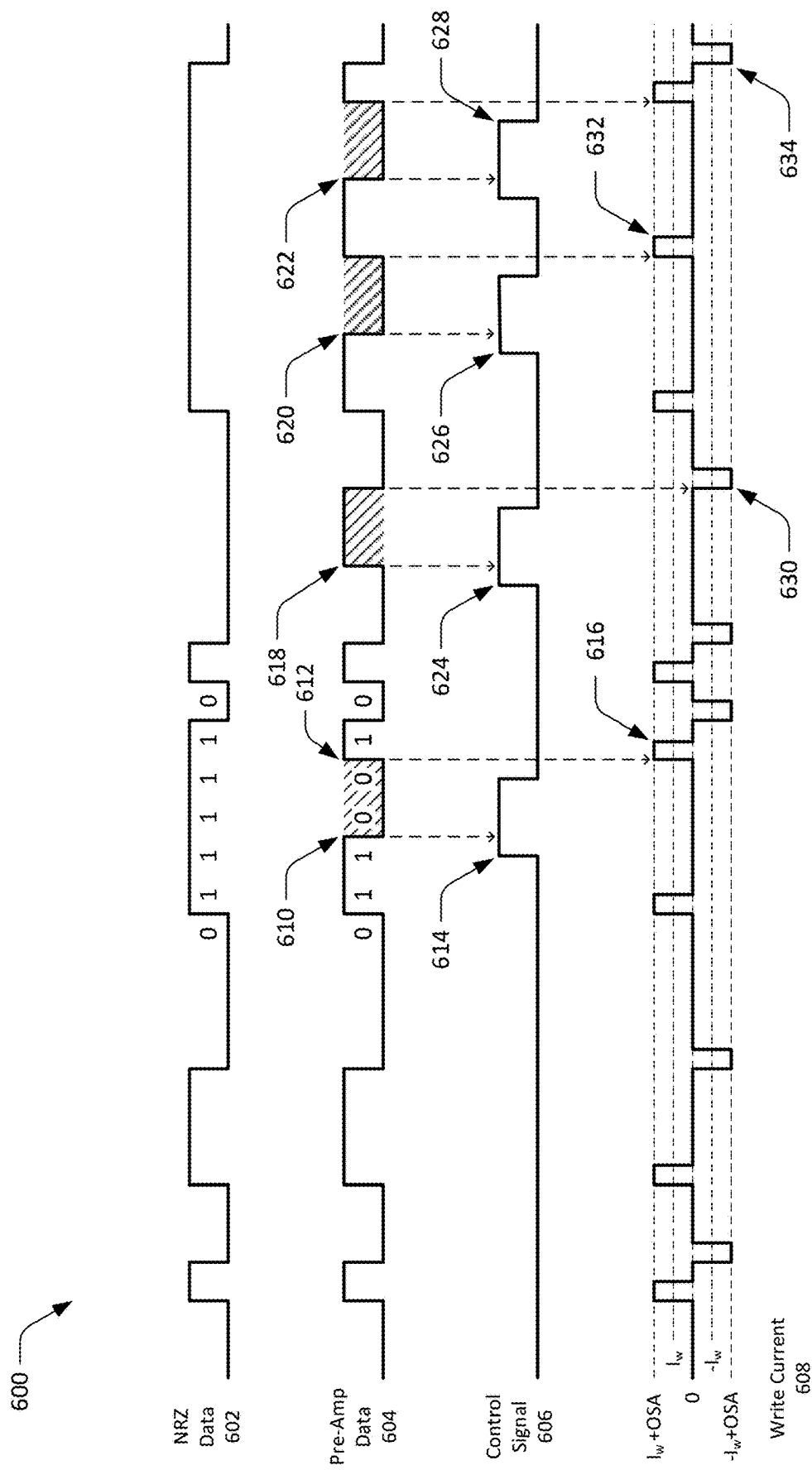
FIG. 6 illustrates another example graph of pre-amp data that includes transitions in accordance with one or more aspects.

FIG. 6 illustrates another example graph of pre-amp data at 600 that includes transitions in accordance with various aspects of pulse-based writing. The graphs or waveforms of FIG. 6 include NRZ data 602, pre-amp data 604, a control signal 606, and write current 608. Generally, the NRZ data 602 may be provided to or encoded by the read/write channel 142. In some aspects, a pulse-based writer 144 alters or modifies the NRZ data 602 to provide the pre-amp data 604 for a pre-amp/writer 134 or pre-amplifier circuitry 310. Alternately or additionally, the pulse-based writer 144 may generate or set the control signal 606 to the pre-amp/writer 134 or pre-amplifier circuitry 310 (or pulse-based writing circuitry 136). In various aspects, based on the pre-amp data 604 and/or the control signal 606, the pre-amp/writer 134 or pre-amplifier circuitry 310 generates pulses of write current 608 to form or write magnets to magnetic storage media. Any or all of the NRZ data 602, pre-amp data 604, control signal 606, and/or write current 608 may be configured or implemented similarly as described with reference to FIG. 5 or other aspects of pulse-based writing.

In this example, the pulse-based writer 144 of the read/write channel 142 may be configured to insert pairs of fake transitions (e.g., 2T inverted signals) into an NRZ or NRZi data path for various magnets or magnets that exceed a geometry of a write head, such as 5T or longer magnets. The pulse-based writer is also configured to use the control signal 606 to inhibit or prevent pulses on a first or leading transition of the pair of transitions. As shown in FIG. 6, the pulse-based writer 144 may insert a pair of fake transitions 610 and 612 to modify or alter the pre-amp data 604. In other words, a 5T magnet (0111110) may be modified as or to mimic a 2T2T1T magnet (0110010) in the pre-amp data 604.

In some cases, the pulse-based writer 144 also asserts or generates a control signal at 614 to mask the leading fake transition 610 causing the write current 608 to pulse at 616 with the same direction as the previous pulse at the start of the magnet. In other words, when the control signal 606 is high or asserted, the pre-amp/writer 134 or pulse-writing circuitry 136 may be inhibited or prevented from outputting a pulse of write current. The pulse-based writer 144 may also insert fake transitions in the NRZ data 602 that correspond to respective long magnets as shown at 618, 620, and/or 622. As shown in FIG. 6, the pulse-based writer 144 also asserts the control signal 606 at 624, 626, and 628 to prevent the pre-amp/writer 134 from pulsing on the leading fake transition effective to provide pulses of write current shown at 630, 632, and 634.

The read/write channel 142 or pulse-based writer 144 may be implemented through any suitable combination of logic, circuitry, or software executed by a hardware-based processor to implement aspects of pulse-based writing. In some cases, aspects of method 400 and/or signal waveforms of FIG. 6 may be implemented through the logic of Table 2 in which:

TABLE 2

Logic for 2T transitions on an NRZi path for pre-amp data Control Signal $w_i = !\ (w_{i-1}|v_i|v_{i+1}|v_{i+2}) \& (v_{i+3}\ |!\ (v_{i-1}|w_{i-2}))$ $v_i$ denotes NRZi bit at time i
$v'_i$ denotes NRZi sequence sent to preamp ($v'_i = v_i + w_i + w_{i-1}$, + denotes XOR)
$w_i$ denotes control signal at time i
$u_i$ denotes NRZ bit at time i ($u_i = u_{i-1} + v_i$)
$u'_i$ denotes NRZ sequence sent to preamp ($u'_i = u'_{i-1} + v'_i$)

By pulsing the write current 608 as shown in FIG. 6, the pulse-based writer 144 may enable the formation of magnets in magnetic media more efficiently or with less distortion to the data in neighboring tracks.

Figure 7:
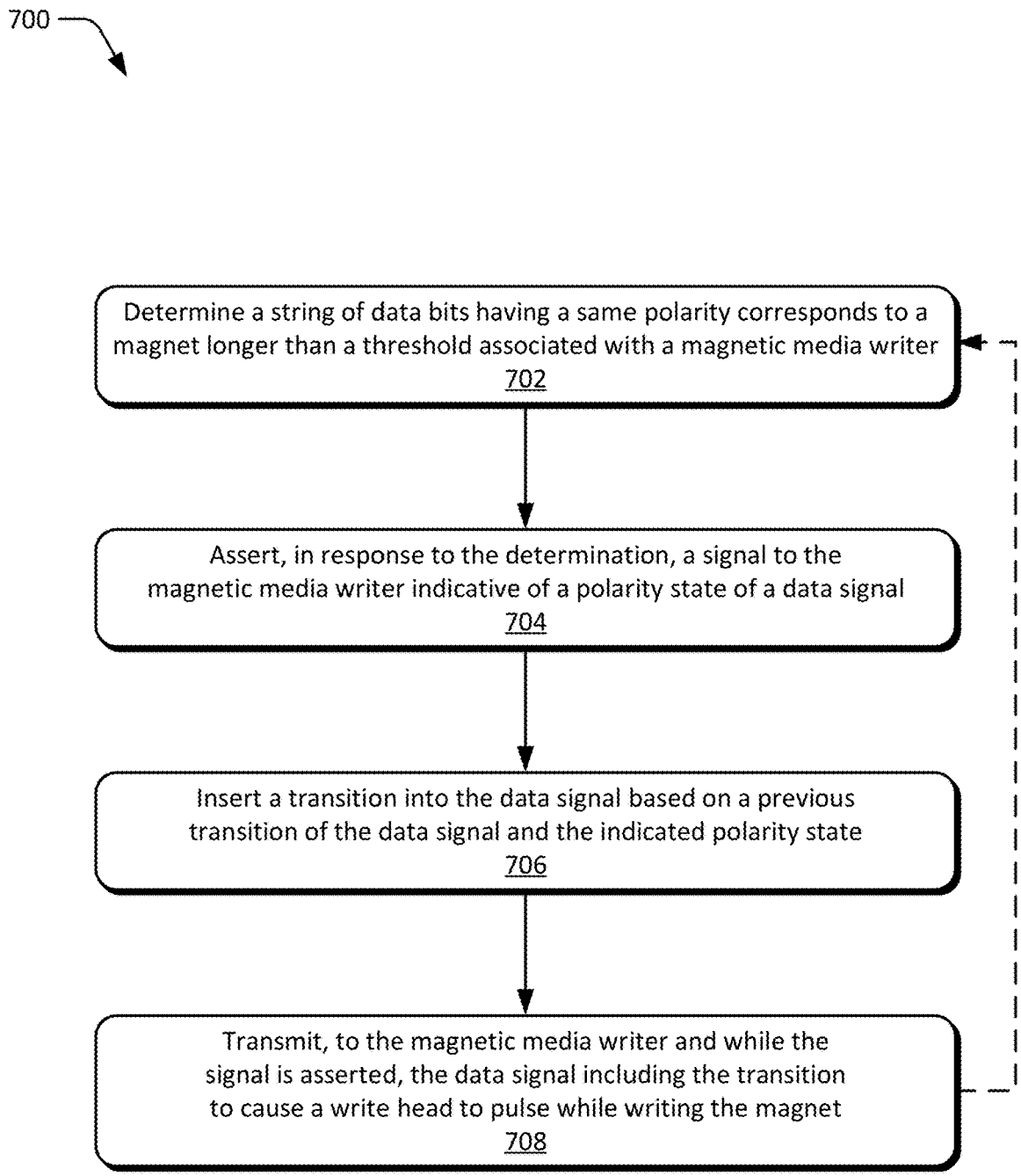
FIG. 7 depicts an example method for pulse-based writing with polarity control.

FIG. 7 depicts an example method 700 for pulse-based writing with polarity control. The operations of method 700 may be performed by or with the pulse-based writing circuitry 136, read/write channel 142, and/or pulse-based writer 144.

At 702, a pulse-based writer determines that a string of data bits having the same polarity corresponds to a threshold associated with a magnetic media writer. The threshold may correspond with or be based on a geometry of a write head of the magnetic media writer, such as approximately a length of the write head or one or more bits shorter (e.g., 4T for a 5T long write head). In some cases, a number of consecutive bits of the same polarity are compared with a predefined threshold. As described herein, the predefined threshold may be defined based on the geometry of the write head or the geometry of magnets that are written to the magnetic storage media. In such cases, the predefined threshold may correspond to an approximate length or effective length of the write head with respect to the length of the magnets. For example, the predefined threshold may be set to enable determination or detection of magnets that meet or exceed four to six bit periods or magnet periods (e.g., 4T, 5T, or 6T).

At 704, the pulse-based writer asserts, in response to the determination, a signal to the magnetic media writer indicative of the polarity state of the data signal to which the magnet corresponds. In some cases, the control signal asserted to the magnetic media writer (e.g., pre-amp/writer 134 and/or write head 132) enables polarity control or management of the magnetic media writer. For example, the use of the control signal for polarity control may enable the pulse-based writer to alter the polarity of the magnetic media writer before a fake transition in encoded data bits is processed. Alternately or additionally, the control signal may change polarity for or with each fake transition that is injected into an encoded data bit signal.

At 706, the pulse-based writer inserts a transition into the data signal based on a previous transition of the data signal and the indicated polarity state. For example, if the control signal is in the same state, then a transition with the opposite polarity may be inserted. Alternately, if the control signal has changed since the last transition, a fake transition may be injected with the same polarity as a previous or preceding transition. In some cases, the pulse-based writer may insert a fake transition every 4T of a long magnet with an option for every 3T. In other cases, an option may enable the insertion of fake transitions at 1T in the event the next bit or sample is another transition of the bit pattern. Alternately or additionally, for multiple 1T transitions, shorter pulses (e.g., less than 1T) may be implemented, or another control signal may be provided to the pre-amp to indicate whether it is pulsing on a rising edge or a falling edge of the NRZi data signal.

At 708, the pulse-based writer transmits, to the magnetic media writer and while the signal is asserted, the data signal including the transition to cause the write head to pulse while writing the magnet. In some aspects, one of the transitions in combination with the polarity control signal may cause the magnetic media writer to generate or provide a pulse of the write current to the write head. One or more pulses of write current, provided after an initial pulse at a start of a magnet, may enable the pulse-based writer to write long magnets more efficiently or with minimal distortion of data in neighboring tracks. From operation 708, the method 700 may return to operation 702 to implement another iteration of the method 700, or to any other operation to implement aspects of pulse-based writing, such as to provide multiple pulses during a long magnet.

Figure 8:
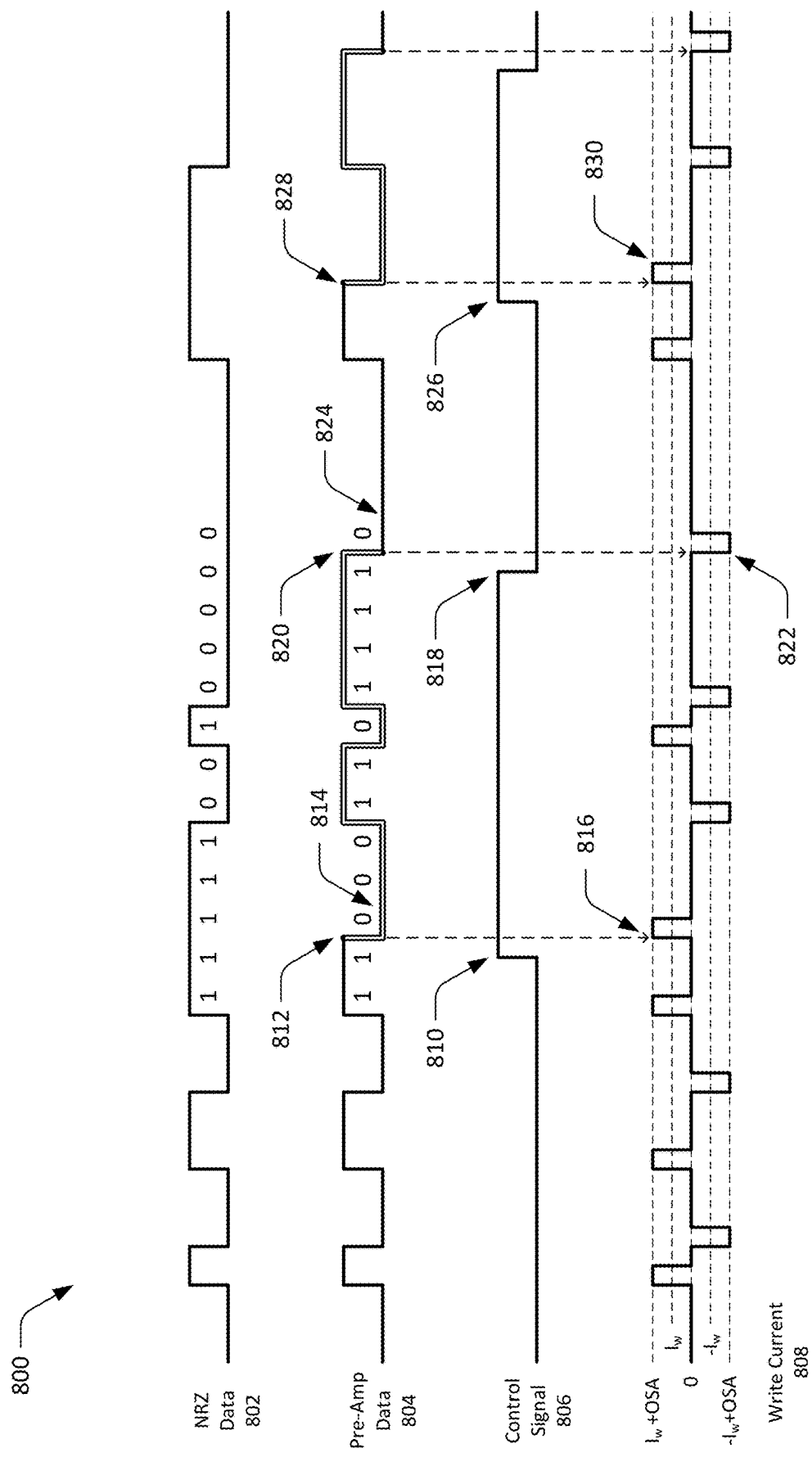
FIG. 8 illustrates example graphs of pre-amp data and a control signal for polarity control in accordance with one or more aspects.

By way of example, consider FIG. 8 which illustrates example graphs of pre-amp data and a control signal for polarity control in accordance with one or more aspects. The graphs or waveforms of FIG. 8 include NRZ data 802, pre-amp data 804, a control signal 806, and write current 808. Generally, the NRZ data 802 (or NRZi data) may be provided to or encoded by a read/write channel 142. In some aspects, a pulse-based writer 144 alters or modifies (e.g., inverts) the NRZ data 802 to provide the pre-amp data 804 for a pre-amp/writer 134 or pre-amplifier circuitry 310. Alternately or additionally, the pulse-based writer 144 may generate or set the control signal 806 to the pre-amp/writer 134 or pre-amplifier circuitry 310 (or pulse-based writing circuitry 136). In various aspects, based on the pre-amp data 804 and/or control signal 806, the pre-amp/writer 134 or pre-amplifier circuitry 310 generates pulses of write current 808 to form or write magnets to magnetic storage media. Any or all of the NRZ data 802, pre-amp data 804, control signal 806, and/or write current 808 may be configured or implemented similarly to that described with reference to FIG. 5 or other aspects of pulse-based writing.

In this example, the pulse-based writer 144 of the read/write channel 142 may be configured to insert a fake transition every 4T of a long magnet with an option for every 3T, for magnets that exceed a geometry of a write head. The pulse-based writer is also configured to use the control signal 806 to indicate or control polarity at the pre-amp/writer 134. As shown in FIG. 8, the pulse-based writer 144 may assert the control signal at 810 to change polarity before a fake transition 812 occurs and the NRZ data is inverted at 814. As shown in FIG. 8, the fake transition 812 is effective to provide a pulse of write current at 816 with the same polarity as the previous transition. At 818, the pulse-based writer 144 again changes polarity before another fake transition at 820 to provide another pulse of the write current at 822. Here, note that the NRZ data polarity is reversed again whereby the pre-amp data 804 has the same polarity at 824. Concluding the present example, the pulse-based writer 144 changes polarity once more at 826 to enable another fake transition 828, which generates a pulse of the write current at 830.

The read/write channel 142 or the pulse-based writer 144 may be implemented through any suitable combination of logic, circuitry, or software executed by a hardware-based processor to implement aspects of pulse-based writing. In some cases, aspects of method 700 and/or signal waveforms of FIG. 8 may be implemented through the logic of Table 3 in which:

By pulsing the write current 808 as shown in FIG. 8, the pulse-based writer 144 may enable the formation of magnets in magnetic media more efficiently or with less distortion to data in neighboring tracks.

Figure 9:
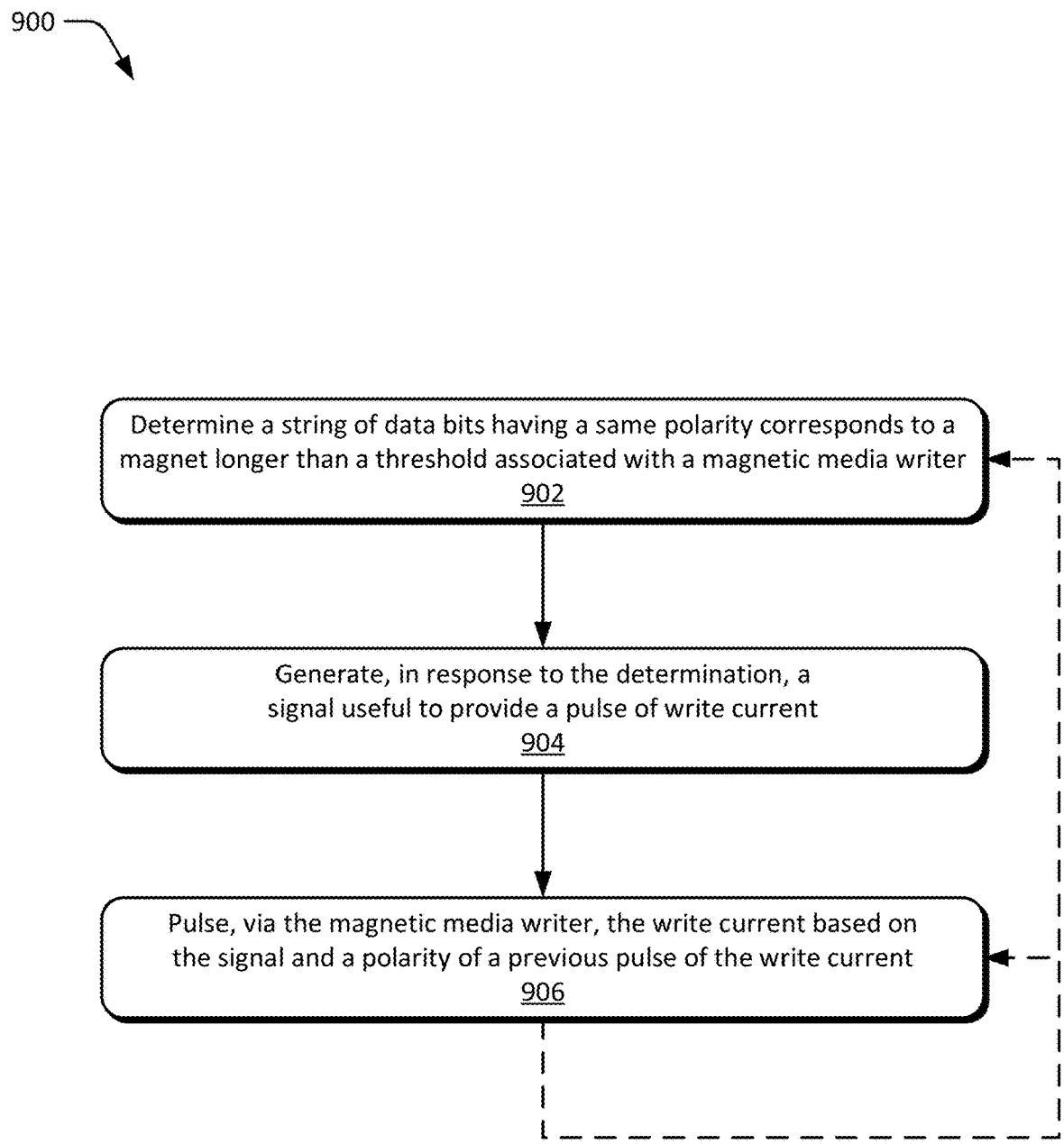
FIG. 9 depicts an example method for pulse-based writing based on a control signal.

FIG. 9 depicts an example method 900 for pulse-based writing based on a control signal. The operations of method 900 may be performed by or with the pulse-based writing circuitry 136, read/write channel 142, and/or pulse-based writer 144.

At 902, a pulse-based writer determines that a string of data bits having a same polarity corresponds to a threshold associated with a magnetic media writer. The threshold may correspond with or be based on a geometry of a write head of the magnetic media writer, such as approximately a length of the write head or one or more bits shorter (e.g., 4T for a 5T long write head). In some cases, a number of consecutive bits of the same polarity are compared with a predefined threshold. As described herein, the predefined threshold may be defined based on the geometry of the write head or the geometry of magnets that are written to the magnetic storage media.

At 904, the pulse-based writer generates, in response to the determination, a signal useful to provide a pulse of write current. In some aspects, the pulse-based writer pulses the control signal at 4T or similar intervals for long magnets. The pulse-based writer may be configured to pulse earlier for a last pulse so that the last pulse occurs at least 2-3T prior to a next transition to a different polarity. Alternately or additionally, the pre-amp/writer may be configured to track the polarity, such as to ensure that the control signal causes additional pulses of the previous or same transition of a magnet being written.

At 906, the pulse-based writer pulses, via the magnetic media writer, the write current based on the signal and the polarity of a previous pulse of the write current. Generally, the control signal may be used to indicate when an additional or extra pulse is needed to write another portion of a long magnet. In response to the control signal, the pre-amp/writer may pulse the write current based on the control signal and the polarity of a previous transition of the encoded data to generate the extra pulses. From operation 906, the method 900 may return to operation 902 to implement another iteration of the method 900, or to any other operation (906) to implement aspects of pulse-based writing, such as to provide multiple pulses for a long magnet.

Figure 10:
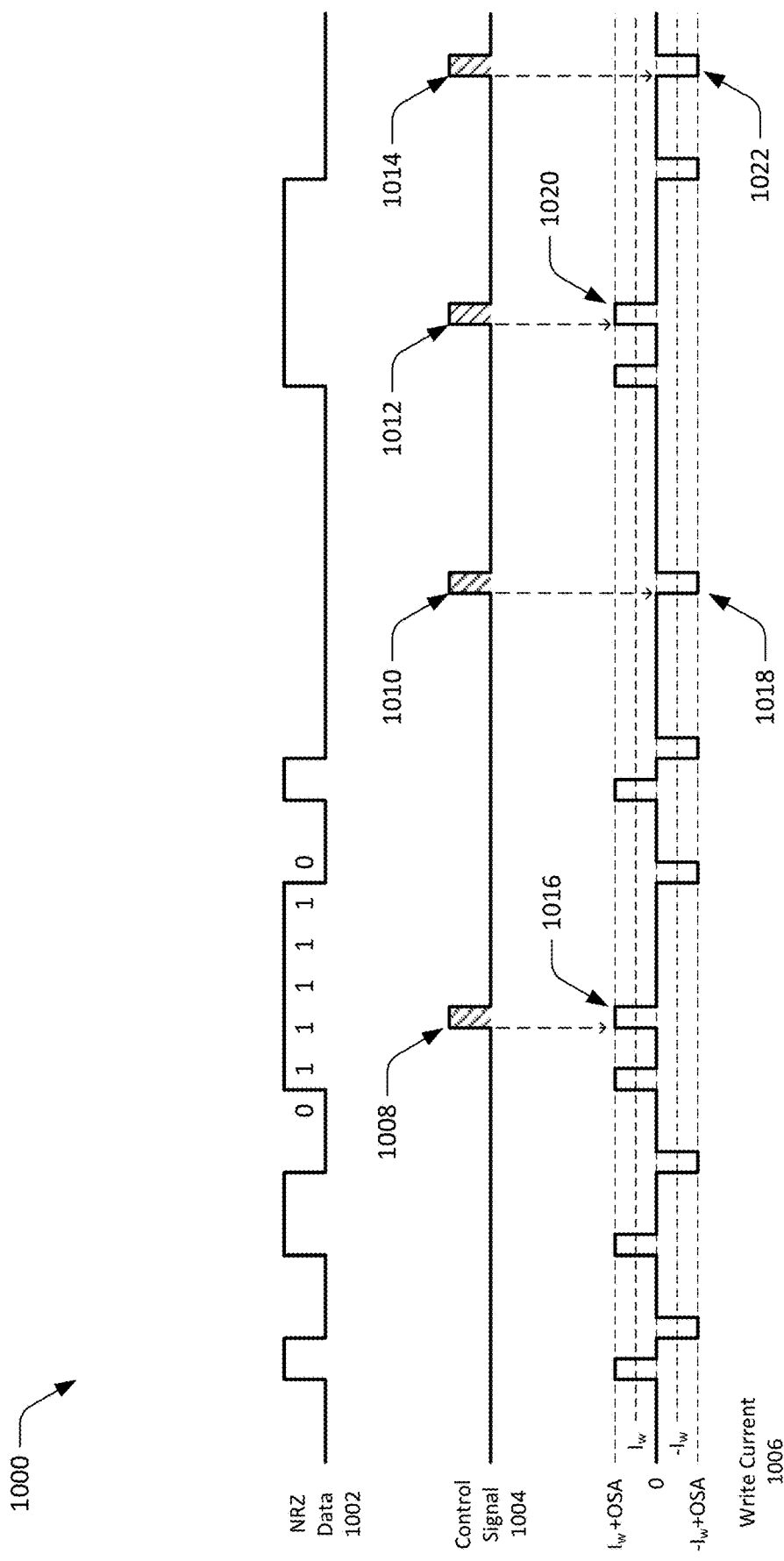
FIG. 10 illustrates an example graph of a control signal for pulse-based writing in accordance with one or more aspects.

By way of example, consider FIG. 10 which illustrates at 1000 an example graph of a control signal for pulse-based writing in accordance with various aspects of pulse-based

TABLE 3

Logic for pulse writing with polarity control

| Pulse_3T_EN | Pulse_GAP_DIS | Control Signal |
|---|---|---|
| 0 | 0 | $p_i = !\ (p_{i-2}|p_{i-1}|v_{i-2}|v_{i-1}|v_i) \& (v_{i+1}|!\ (p_{i-3}|v_{i-3}))$ |
| 0 | 1 | $p_i = !\ (p_{i-3}|p_{i-2}|p_{i-1}|v_{i-3}|v_{i-2}|v_{i-1}|v_i)$ |
| 1 | 0 | $p_i = !\ (p_{i-1}|v_{i-1}|v_i) \& (v_{i+1}|!\ (p_{i-2}|v_{i-2}))$ |
| 1 | 1 | $p_i = !\ (p_{i-2}|p_{i-1}|v_{i-2}|v_{i-1}|v_i)$ |

Let $v_i$ denote NRZ bit transition, let $v'_i$ denote transition sequence sent to the pre-amp, and let $p_i$ denote control signal polarity switch
Let t represent value of PULSE_3T_EN: One-bit register to enable pulsing every 3T instead of every 4T
Let G represent PULSE_GAP_DIS[0] One-bit register to disable pulsing 1T early in case of upcoming transitions
A control signal will transition based on $p_i$ in table below when PULSE_EN = 1
$v_i$ denotes NRZi bit at time i
$v'_i$ denotes NRZi sequence sent to preamp ($v'_i = v'_i + p_i$ + denotes XOR)
$p_i$ denotes polarity switch signal at time i ($w_i = w_{i-1} + p_i$, + denotes XOR)

writing. The graphs or waveforms of FIG. 10 include NRZ data 1002, a control signal 1004, and a write current 1006. Generally, the NRZ data 1002 (or NRZi data) may be provided to or encoded by a read/write channel 142. In some aspects, a pulse-based writer 144 may generate or set the control signal 1004 to the pre-amp/writer 134 or the pre-amplifier circuitry 310 (or pulse-based writing circuitry 136) to cause or trigger pulses of write current. Any or all of the NRZ data 1002, control signal 1004, and/or write current 1006 may be configured or implemented similarly as described with reference to FIG. 5 or other aspects of pulse-based writing.

In this example, the pulse-based writer 144 of the read/write channel 142 may be configured to use the control signal 1004 to pulse the write current 1006 at 4T intervals for magnets that exceed a geometry of a write head. As shown in FIG. 10, for data that corresponds to respective long magnets, the pulse-based writer 144 may assert the control signal 1004 at 1008, 1010, 1012, and/or 1014 to cause or trigger pulses in the write current 1006. Concluding the present example and in accordance with the control signal 1004 provided by the pulse-based writer, the pre-amp/writer generates pulses of the write current 1006 at 1016, 1018, 1020, and 1022.

FIG. 11 depicts an example method 1100 for relaxing the write current of a magnetic media writer. The operations of method 1100 may be performed by or with the pulse-based writing circuitry 136, read/write channel 142, and/or pulse-based writer 144.

At 1102, a pulse-based writer determines that a string of data bits having the same polarity corresponds to a threshold associated with a magnetic media writer (e.g., a length of the write head). The threshold may correspond with or be based on a geometry of a write head of the magnetic media writer, such as approximately a length of the write head or one or more bits shorter (e.g., 4T for a 5T long write head). In some cases, a number of consecutive bits of the same polarity are compared with a predefined threshold. Alternately or additionally, the predefined threshold may be defined based on the geometry of the write head or the geometry of magnets that are written to the magnetic storage media.

At 1104, the pulse-based writer asserts, in response to the determination, a signal useful to extend a pulse of write current for at least a portion of the magnet. Alternately or additionally, the signal may be useful to relax the write current from an overshoot amplitude to a baseline write current or to an off-state or pre-bias voltage for a transition to the opposite polarity. In some aspects, the signal, such as the control signal provided to the pre-amp/writer, is used to directly control or affect the write current. The control signal may be asserted at a beginning of a long magnet and deasserted at a predefined duration of time before a transition to a next polarity.

At 1106, the pulse-based writer maintains, via the magnetic media writer, at least a portion of the write current based on the signal and the length of the magnet. For example, based on the asserted control signal, the magnetic media writer may relax the write current from an overshoot level to a baseline write level. Alternately or additionally, in response to deassertion of the control signal, the magnetic media writer may relax the write current to an off-state (e.g., from a positive level) or a pre-bias state (e.g., less than 0) in advance to a transition to the opposite polarity (e.g., negative polarity).

Optionally at 1108, the pulse-based writer deasserts, based on the length of the magnet, the signal to enable the write current to cease prior to the next pulse transition. As noted, the control signal may be deasserted based on an upcoming transition to the opposite polarity. By so doing, an overall swing of write current at the next transition may be reduced, enabling a faster or cleaner transition by the magnetic media writer.

Figure 12:
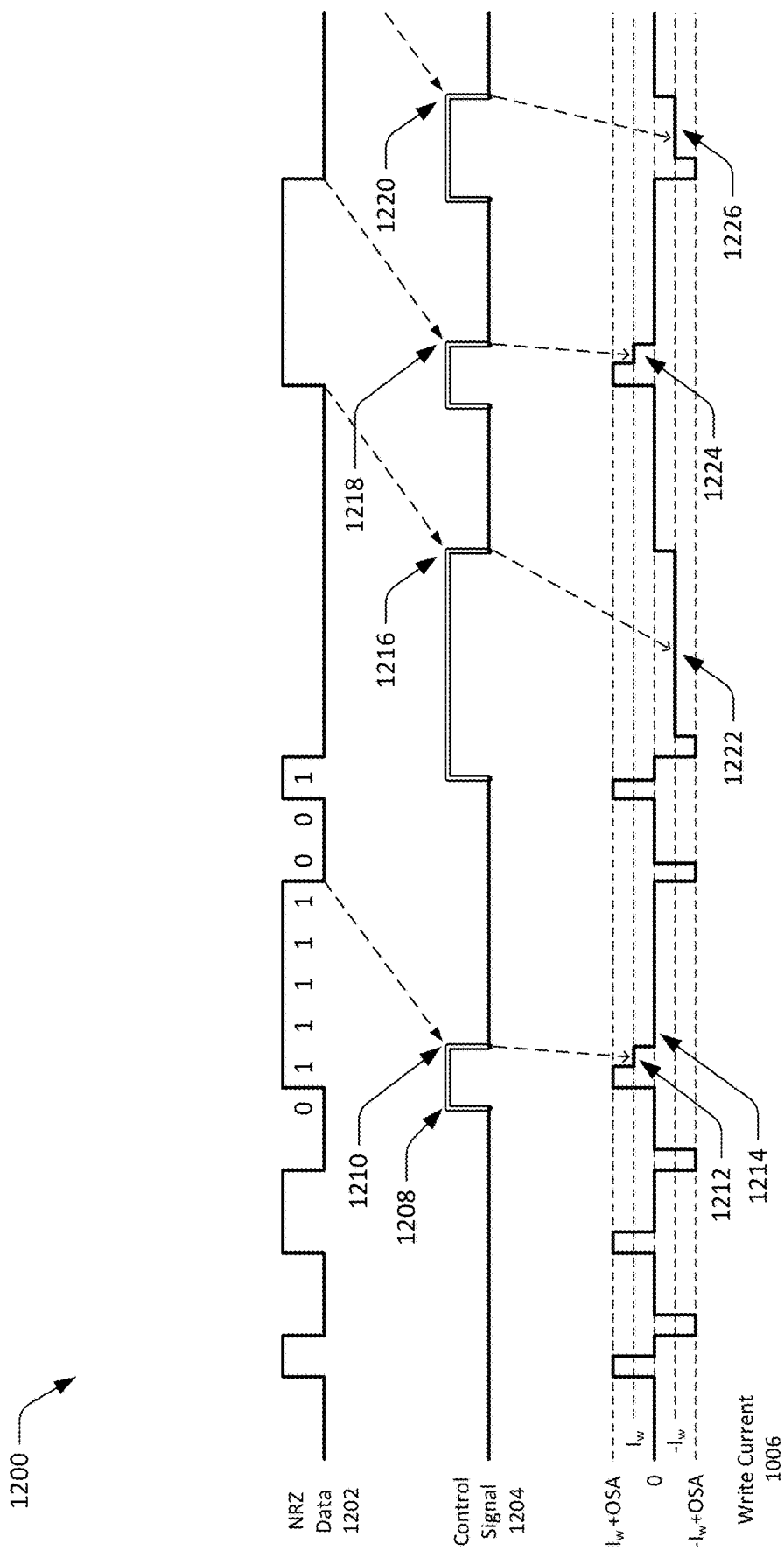
FIG. 12 illustrates an example graph of a control signal useful to relax write current in accordance with one or more aspects.

By way of example, consider FIG. 12 which illustrates at 1200 an example graph of a control signal useful to relax write the current in accordance with one or more aspects. The graphs or waveforms of FIG. 12 include NRZ data 1202, a control signal 1204, and write current 1206. Generally, the NRZ data 1202 (or NRZi data) may be provided to or encoded by a read/write channel 142. In some aspects, the pulse-based writer 144 may generate or set the control signal 1204 to the pre-amp/writer 134 or pre-amplifier circuitry 310 (or pulse-based writing circuitry 136). In various aspects, based on the control signal 1204, the pre-amp/writer 134 or pre-amplifier circuitry 310 relaxes the write current 1206, such as when forming or writing long magnets. Any or all of the NRZ data 1202, control signal 1204, and/or write current 1206 may be configured or implemented similarly as described with reference to FIG. 5 or other aspects of pulse-based writing.

In this example, the pulse-based writer 144 of the read/write channel 142 may be configured to control the write current directly, such as to support two levels of write current or current relaxation. Generally, the pulse-based writer 144 may assert the control signal 1204 at the beginning of a magnet and deassert the control line 1204 approximately 4T prior to a transition of another magnet. In other words, the control signal 1204 may pulse for long magnets and relax to a lower write current (of the same polarity), off-state, or pre-bias setting near the tail end of a magnet.

As shown in FIG. 12, the pulse-based writer 144 may assert the control signal at 1208 to relax the write current 1006 to a baseline level, and then deassert the control line at 1210 (~4T prior to the transition) to allow the write current to settle to about 0 or an off-state. By so doing, the write current may cleanly or quickly transition based on the polarity of the next magnet to be written. Similarly, the control signal 1204 may also be deasserted at 1216, 1218, and/or 1220 in accordance with aspects of current relaxation. As shown in FIG. 12, this enables the write current to relax at 1222, 1224, and 1226 to a baseline current while at least a portion of a long magnet is written, and then relax further to approximately 0 or an opposite-polarity pre-bias state for an upcoming transition.

The read/write channel 142 or pulse-based writer 144 may be implemented through any suitable combination of logic, circuitry, or software executed by a hardware-based processor to implement aspects of pulse-based writing. In some cases, aspects of method 1100 and/or signal waveforms of FIG. 12 may be implemented through the logic of Equations 1 and 2 in which:

Control signal goes down 3T prior to next transition:

$$w_i = !(v_{i+3}|v_{i+2}|v_{i+1})$$

Equation 1: Control Signal for 3T Advance Transitions

Control signal goes down 4T prior to next transition:

$$w_i = !(v_{i+4}|v_{i+3}|v_{i+2}|v_{i+1})$$

Equation 2: Control Signal for 4T Advance Transitions

Figure 13:
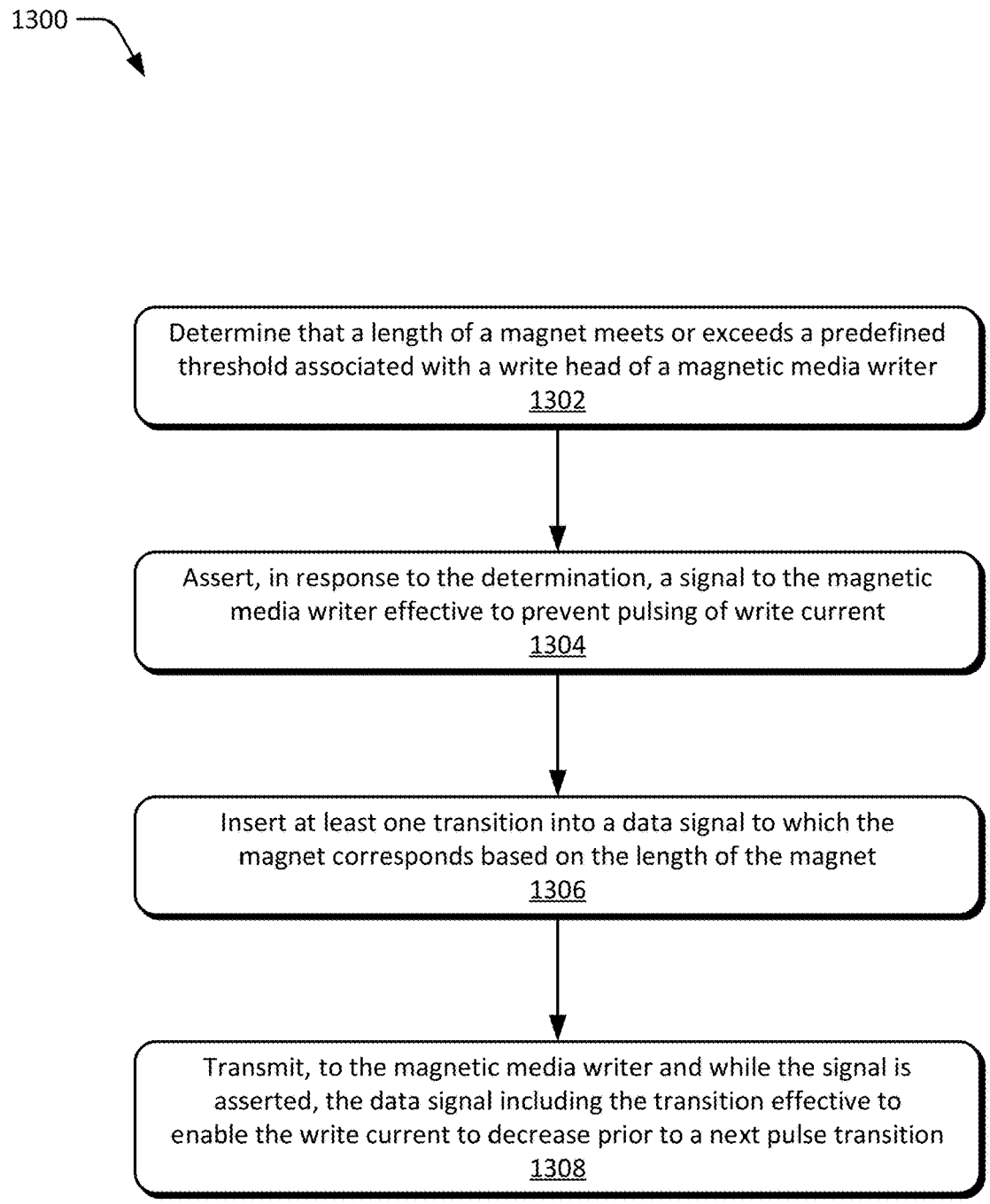
FIG. 13 depicts an example method for relaxing write current with transitions inserted in pre-amp data.

With register support provided by:
3T_RELAX_EN: One-bit register forcing control signal to operate in relax mode With 3T_RELAX_EN=1, control signal goes down 3T before next transition FIG. 13 depicts an example method 1300 for relaxing write current with transitions inserted in pre-amp data. The operations of method 1300 may be performed by or with the pulse-based writing circuitry 136, read/write channel 142, and/or pulse-based writer 144.

At 1302, a pulse-based writer determines that the length of a magnet meets or exceeds a predefined threshold associated with a write head of a magnetic media writer. The predefined threshold may be configured based on the geometry of the write head relative to the bit size of magnets in the magnetic storage media associated with which the write head. For example, the predefined threshold may be used to detect or determine that the magnet is longer than the write head of a magnetic media writer and may be a candidate magnet for current relaxation.

At 1304, the pulse-based writer asserts, in response to the determination, a signal to the magnetic media writer to prevent pulsing of write current. In some aspects, the signal is a control signal that may be used to mask transitions that may be useful to implement current relaxation. In other words, when the control signal is asserted, a magnetic media writer (e.g., pre-amp/writer) may not change or output a pulse of the write current in response to transitions of the data signal or waveform. Alternately or additionally, the magnetic media writer may be configured to set the write current to a baseline level, an off-state (0), or an opposite-polarity pre-bias level.

At 1306, the pulse-based writer inserts at least one transition into a data signal to which the magnet corresponds based on the length of the magnet. In some cases, pairs of fake transitions or an inverted signal may be inserted into the data signal or a data waveform. The transitions or inverted signal may be inserted at a predefined spacing or duration prior to a next transition, such as 4T or 6T prior to an end of a magnet to which the data corresponds.

At 1308, the pulse-based writer transmits, to the magnetic media writer while the signal is asserted, the data signal including the transition effective to enable the write current to decrease prior to the next pulse transition. As noted, the fake transitions may be inserted based on an upcoming transition to the opposite polarity to allow the write current to relax from an overshoot current to a baseline current, zero current, or opposite-polarity pre-bias current. By so doing, an overall swing of write current at the next transition may be reduced, enabling a faster or cleaner transition by the magnetic media writer.

Figure 14:
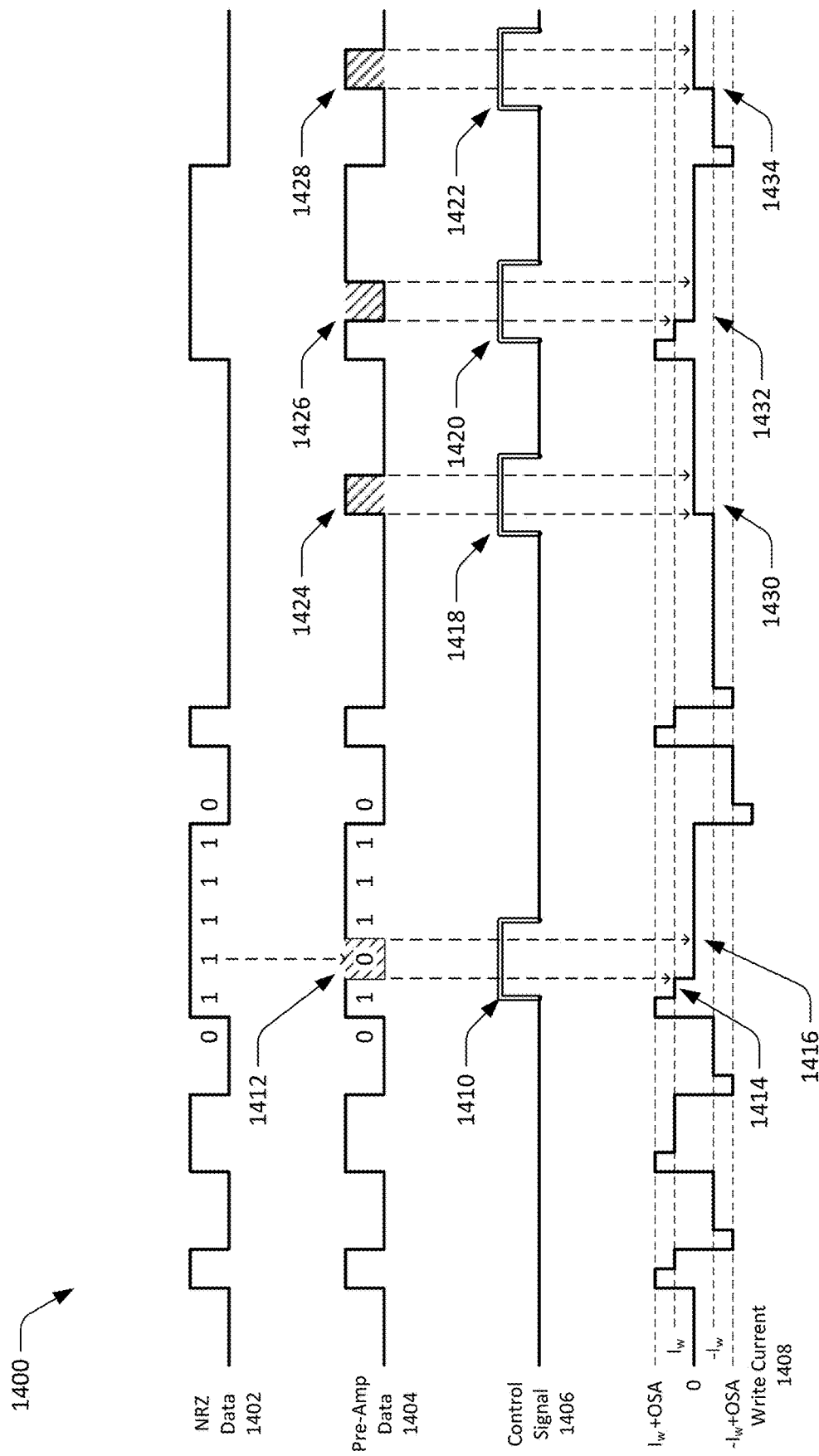
FIG. 14 illustrates an example graph of pre-amp data that includes transitions in accordance with one or more aspects.

By way of example, consider FIG. 14 which illustrates at 1400 an example graph of pre-amp data that includes transitions in accordance with one or more aspects of current relaxation. The graphs or waveforms of FIG. 14 include NRZ data 1402, pre-amp data 1404, a control signal 1406, and write current 1408. Generally, the NRZ data 1402 (or NRZi data) may be provided to or encoded by a read/write channel 142. In some aspects, a pulse-based writer 144 alters or modifies (e.g., inverts) the NRZ data 1402 to provide the pre-amp data 1404 for a pre-amp/writer 134 or pre-amplifier circuitry 310. Alternately or additionally, the pulse-based writer 144 may generate or set the control signal 1406 to the pre-amp/writer 134 or pre-amplifier circuitry 310 (or pulse-based writing circuitry 136). In various aspects, based on the pre-amp data 1404 and/or control signal 1406, the pre-amp/writer 134 or pre-amplifier circuitry 310 relax the write current 1408 from an overshoot level (or other initial or max value) to a lower write current, off-state, or pre-bias current. Any or all of the NRZ data 1402, pre-amp data 1404, control signal 1406, and/or write current 1408 may be configured or implemented similarly as described with reference to FIG. 5 or other aspects of pulse-based writing.

In this example, the pulse-based writer 144 of the read/write channel 142 may be configured to insert pairs of fake transitions or inverted signals 4T prior to the end of the magnet. In some aspects, this may be effective to disable or reduce the write current 1408 without generating additional pulses in the write current. As such, combined aspects of pulse-based writing and current relaxation may be implemented with multiple control signals or registers shared between the read/write channel and the pre-amp/writer of a media drive. In this example, the pulse-based writer 144 is also configured to use or generate the control signal to mask both of the fake transitions, where if control signal is high, then the pre-amp/writer does not output a write pulse for that transition. Instead, the pre-amp/writer may set the write current to 0 or another programmable or predefined value. For example, the pulse-based writer may assert the control signal 1406 at 1410 and insert fake transitions at 1412 such that a 5T magnet (0111110) becomes 1T1T3T (0101110) as shown in FIG. 14. Alternately, a pair of fake transitions could be spaced or separated approximately by 2T, providing a 5T magnet that becomes 2T2T1T (0110010). As shown in FIG. 14, these transitions are effective to cause the write current 1408 to relax to the baseline write current at 1414 and to zero or an off-state at 1416. Similarly, the pulse-based writer may assert the control line 1406 at 1418, 1420, and/or 1422 to mask pairs of fake transitions inserted at 1424, 1426, and 1428. Responsive to these masked transitions, the pre-amp/writer may relax the write current 1408 as shown at 1430, 1432, and 1434. By so doing, an overall swing of the write current at the next transition may be reduced, enabling a faster or cleaner transition by the magnetic media writer.

The read/write channel 142 or pulse-based writer 144 may be implemented through any suitable combination of logic, circuitry, or software executed by a hardware-based processor to implement aspects of pulse-based writing. In some cases, aspects of method 1300 and/or signal waveforms of FIG. 14 may be implemented through the logic of Table 4 in which:

TABLE 4

Logic for current relaxation with fake bits

| Relax_3T_EN | Relax_Early_EN | Control Signal |
|---|---|---|
| 0 | 0 | $p_i = !\ (v_{i+3}|v_{i+2}|v_{i+1}|v_i)\&v_{i+4}$ |
| 0 | 1 | $p_i = !\ (v_{i+1}|v_i)\&[(v_{i+4}\ \&!\ (v_{i+3}|v_{i+2}))|(v_{i-1}\&(v_{i+2}|v_{i+3}))]$ |
| 1 | 0 | $p_i = !\ (v_{i+2}|v_{i+1}|v_i)\&v_{i+3}$ |
| 1 | 1 | $p_i = !\ (v_{i+1}|v_i)\&[(v_{i+3}\ \&!\ v_{i+2})|v_{i-1}\&v_{i+2}]$ |

Control signal will be high based on $p_i$ and $p_{i-1}$ in table below
$v_i$ denotes NRZi bit at time i
$v'_i$ denotes NRZi sequence sent to preamp ($v_i' = v_i + p_i + p_{i-1}$, + denotes XOR)
$p_i$ denotes polarity switch signal at time i ($w_i = p_i + p_{i-1}$, + denotes XOR)

By pulsing and/or relaxing the write current 1408 as shown in FIG. 14, the pulse-based writer 144 may enable the formation of magnets in magnetic media more efficiently or with less distortion to data in neighboring tracks.

System-On-Chip

Figure 15:
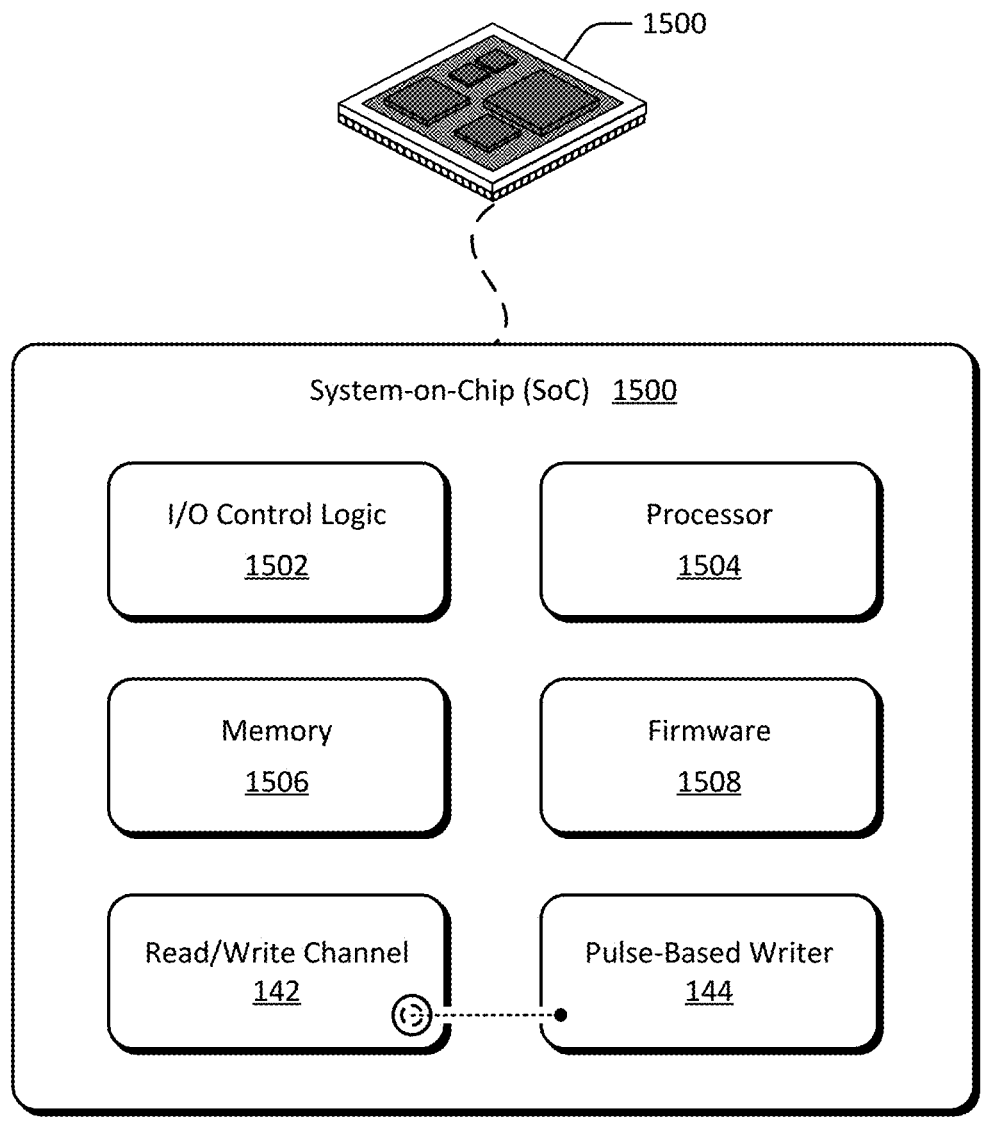
FIG. 15 illustrates an example System-on-Chip (SoC) environment for implementing aspects of pulse-based writing for magnetic storage media.

FIG. 15 illustrates an exemplary System-on-Chip (SoC) 1500 that may implement various aspects of pulse-based writing for magnetic storage media. The SoC 1500 may be implemented in any suitable device, such as a smart-phone, netbook, tablet computer, access point, network-attached storage, camera, smart appliance, printer, set-top box, server, solid-state drive (SSD), magnetic tape drive, hard-disk drive (HDD), storage drive array, memory module, storage media controller, storage media interface, head-disk assembly, magnetic media pre-amplifier, automotive computing system, or any other suitable type of device (e.g., others described herein). Although described with reference to a SoC, the entities of FIG. 15 may also be implemented as other types of integrated circuits or embedded systems, such as an application-specific integrated-circuit (ASIC), memory controller, storage controller, communication controller, application-specific standard product (ASSP), digital signal processor (DSP), programmable SoC (PSoC), system-in-package (SiP), or field-programmable gate array (FPGA).

The SoC 1500 may be integrated with electronic circuitry, a microprocessor, memory, input-output (I/O) control logic, communication interfaces, firmware, and/or software useful to provide functionalities of a computing device or magnetic storage system, such as any of the devices or components described herein (e.g., hard-disk drive). The SoC 1500 may also include an integrated data bus or interconnect fabric (not shown) that couples the various components of the SoC for data communication or routing between the components. The integrated data bus, interconnect fabric, or other components of the SoC 1500 may be exposed or accessed through an external port, parallel data interface, serial data interface, peripheral component interface, or any other suitable data interface. For example, the components of the SoC 1500 may access or control external storage media or magnetic write circuitry through an external interface or off-chip data interface.

In this example, the SoC 1500 is shown with various components that include input-output (I/O) control logic 1502 and a hardware-based processor 1504 (processor 1504), such as a microprocessor, processor core, application processor, DSP, or the like. The SoC 1500 also includes memory 1506, which may include any type and/or combination of RAM, SRAM, DRAM, non-volatile memory, ROM, one-time programmable (OTP) memory, multiple-time programmable (MTP) memory, Flash memory, and/or other suitable electronic data storage. In some aspects, the processor 1504 and code (e.g., firmware) stored on the memory 1506 are implemented as a storage media controller or as part of a storage media interface to provide various functionalities associated with pulse-based writing for magnetic storage media. In the context of this disclosure, the memory 1506 stores data, code, instructions, or other information via non-transitory signals, and does not include carrier waves or transitory signals. Alternately or additionally, SoC 1500 may comprise a data interface (not shown) for accessing additional or expandable off-chip storage media, such as magnetic memory or solid-state memory (e.g., Flash or NAND memory).

The SoC 1500 may also include firmware 1508, applications, programs, software, and/or operating system, which may be embodied as processor-executable instructions maintained on the memory 1506 for execution by the processor 1504 to implement functionalities of the SoC 1500. The SoC 1500 may also include other communication interfaces, such as a transceiver interface for controlling or communicating with components of a local on-chip (not shown) or off-chip communication transceiver. Alternately or additionally, the transceiver interface may also include or implement a signal interface to communicate radio frequency (RF), intermediate frequency (IF), or baseband frequency signals off-chip to facilitate wired or wireless communication through transceivers, physical layer transceivers (PHYs), or media access controllers (MACs) coupled to the SoC 1500. For example, the SoC 1500 may include a transceiver interface configured to enable storage over a wired or wireless network, such as to provide a network attached storage (NAS) device with pulse-based writing features.

The SoC 1500 also includes a read/write channel 142 and a pulse-based writer 144, which may be implemented separately as shown or combined with a storage component or data interface. Alternately or additionally, the SoC 1500 may include interfaces to a pre-amplifier and spindle/motor assembly of a magnetic media disk drive. As described herein, the pulse-based writer 144 may insert transitions into pre-amp data, alter bit polarities, manage a control signal (e.g., for masking), relax write current, configure various bit or current thresholds, or any combination of the like to implement aspects of pulse-based writing for magnetic storage media. Any of these entities may be embodied as disparate or combined components, as described with reference to various aspects presented herein. Examples of these components and/or entities, or corresponding functionality, are described with reference to the respective components or entities of the environment 100 of FIG. 1 or respective configurations illustrated in FIG. 2, and/or FIG. 3. The pulse-based writer 144, either in whole or part, may be implemented as digital logic, circuitry, and/or processor-executable instructions maintained by the memory 1506 and executed by the processor 1504 to implement various aspects or features of pulse-based writing for magnetic storage media.

The SoC 1500 also includes a read/write channel 142 and a pulse-based writer 144, which may be implemented separately as shown or combined with a storage component or data interface. Alternately or additionally, the SoC 1500 may include interfaces to a pre-amplifier and spindle/motor assembly of a magnetic media disk drive. As described herein, the pulse-based writer 144 may insert transitions into pre-amp data, alter bit polarities, manage a control signal (e.g., for masking), relax write current, configure various bit or current thresholds, or any combination of the like to implement aspects of pulse-based writing for magnetic storage media. Any of these entities may be embodied as disparate or combined components, as described with reference to various aspects presented herein. Examples of these components and/or entities, or corresponding functionality, are described with reference to the respective components or entities of the environment 100 of FIG. 1 or respective configurations illustrated in FIG. 2, and/or FIG. 3. The pulse-based writer 144, either in whole or part, may be implemented as digital logic, circuitry, and/or processor-executable instructions maintained by the memory 1506 and executed by the processor 1504 to implement various aspects or features of pulse-based writing for magnetic storage media.

The pulse-based writer 144, may be implemented independently or in combination with any suitable component or circuitry to implement aspects described herein. For example, a pulse-based writer may be implemented as part of a DSP, processor/storage bridge, I/O bridge, graphics processing unit, memory controller, storage controller, arithmetic logic unit (ALU), or the like. The pulse-based writer 144 may also be provided integral with other entities of SoC 1500, such as integrated with the processor 1504, memory 1506, a storage media interface, or firmware 1508 of the SoC 1500. Alternately or additionally, the pulse-based writer 144, and/or other components of the SoC 1500 may be implemented as hardware, firmware, fixed logic circuitry, or any combination thereof.

Figure 16:
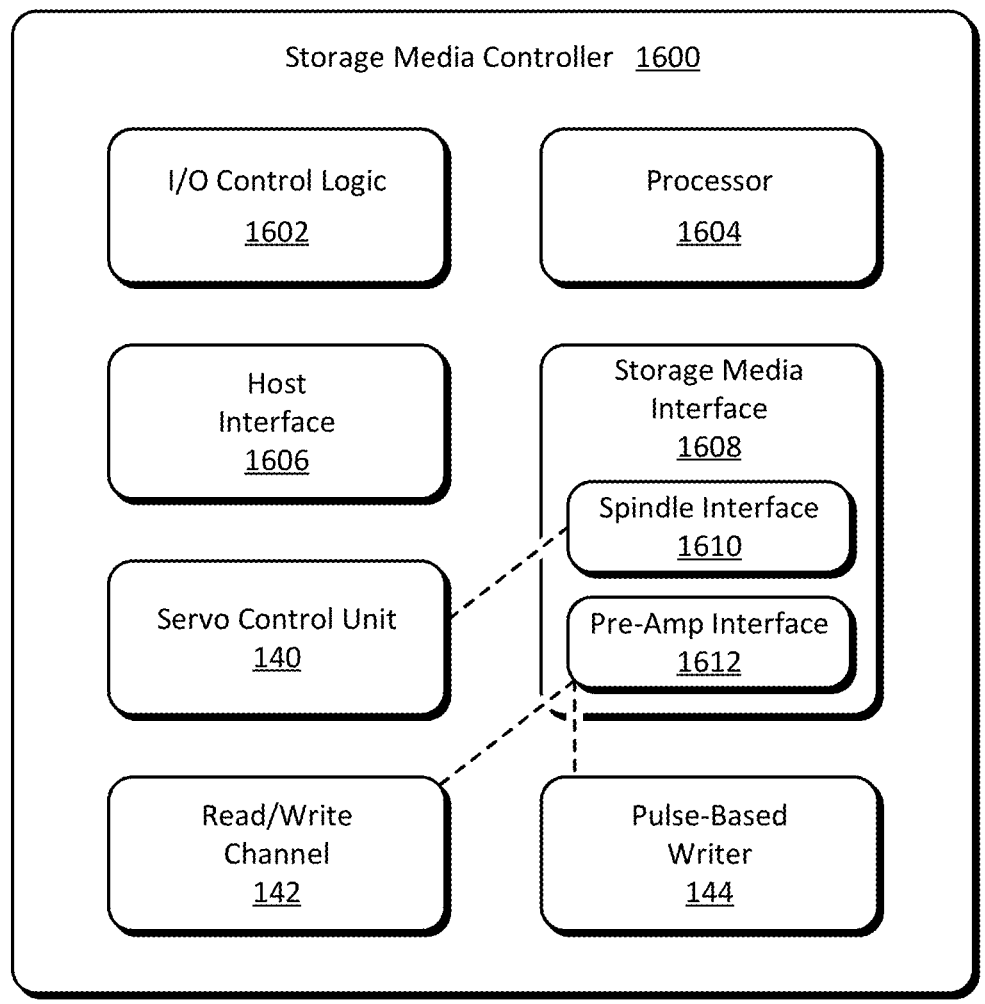
FIG. 16 illustrates an example storage media controller configured to implement aspects of pulse-based writing in magnetic media with which the controller is associated.

As another example, consider FIG. 16 which illustrates an example storage media controller 1600 in accordance with one or more aspects of pulse-based writing for magnetic storage media. Generally, the storage media controller 1600 enables the computing device 102 to access contents of magnetic storage media, such as an operating system, applications, or data for applications or other services. The storage media controller may also write and read data of the computing device 102 to and from the magnetic storage media with which the controller is associated.

In various aspects, the storage media controller 1600 or any combination of components thereof may be implemented as a storage drive controller (e.g., HDD controller or HDD chipset), storage media controller, NAS controller, storage media interface, storage media endpoint, storage media target, or a storage aggregation controller for magnetic storage media, solid-state storage media, or the like (e.g., hybrid SSD/HDD storage systems). In some cases, the storage media controller 1600 is implemented similar to or with components of the SoC 1500 as described with reference to FIG. 15. In other words, an instance of the SoC 1500 may be configured as a storage media controller, such as the storage media controller 1600 to manage magnetic storage media. In this example, the storage media controller 1600 includes input-output (I/O) control logic 1602 and a processor 1604, such as a microprocessor, microcontroller, processor core, application processor, DSP, or the like. The storage media controller also includes a host interface 1606 (e.g., SATA, PCIe, NVMe, or Fabric interface) and a storage media interface 1608 (e.g., magnetic media interface or head-disk assembly (HDA) interface), which enable access to a host system (or fabric) and storage media, respectively. In this example, the storage media interface includes separate instances of a spindle interface 1610 and a pre-amp interface 1612, such as to enable communication with a head-disk assembly of a media drive.

In some aspects, the storage media controller 1600 implements aspects of pulse-based writing for magnetic storage media when managing or enabling access to storage media that is coupled to the storage media interface 1608. The storage media controller 1600 may provide a storage interface for a host system via the host interface 1606, through which storage access commands, such as data to write to the magnetic storage media are received from the host system. As shown in FIG. 16, the storage media controller 1600 may also include a servo control unit 140, read/write channel 142, and a pulse-based writer 144. The servo control unit 140 is operably coupled to the spindle interface 1610 and may provide spindle or voice coil control for a magnetic media drive. In this example the read/write channel 142 and pulse-based writer 144 are operably coupled to the pre-amp interface 1612 and may provide pre-amp data (e.g., modified NRZ bit patterns or waveforms) and/or pulse-writing control signals to pre-amplifier circuitry (or pulse-based writing circuitry of the pre-amplifier) of the media drive. In some aspects, the processor 1604 and firmware or logic of the storage media controller 1600 are implemented to provide various data writing or processing functionalities associated with pulse-based writing for magnetic storage media.

The pulse-based writer 144 of the storage media controller 1600 may be implemented separately as shown or combined with the processor 1604, read/write channel 142, or storage media interface 1608. In accordance with various aspects, the pulse-based writer 144 may insert transitions into pre-amp data, alter bit polarities, manage a control signal (e.g., for masking), relax write current, configure various bit or current thresholds, or any combination of the like. Examples of these components and/or entities, or corresponding functionality, are described with reference to the respective components or entities of the environment 100 of FIG. 1 or respective configurations illustrated in FIG. 2 and/or FIG. 3. The pulse-based writer 144, either in whole or part, may be implemented as processor-executable instructions maintained by memory of the controller and executed by the processor 1604 to implement various aspects and/or features of pulse-based writing for magnetic storage media.

Although the subject matter has been described in language specific to structural features and/or methodological operations, it is to be understood that the subject matter defined in the appended claims is not necessarily limited to the specific examples, features, or operations described herein, including orders in which they are performed.

What is claimed is:

1. A method comprising:
   determining that a string of data bits having a same polarity corresponds to a magnet formed on a magnetic storage media has a magnet length that exceeds a magnet length threshold associated with a magnetic media writer;
   asserting, in response to the determining, a signal to the magnetic media writer to prevent a transition in the string of data bits from causing the magnetic media writer to increase write current applied to a write head of the magnetic media writer;
   inserting, into the string of data bits, at least one transition to a polarity opposite to the same polarity of the string of data bits; and
   transmitting, to the magnetic media writer, the string of data bits including the at least one transition to cause the magnetic media writer to reduce an application of write current applied to the write head while writing the magnet corresponding to the string of data bits to the magnetic storage media.

2. The method of claim 1, wherein transmitting the string of data bits that includes the at least one transition causes the magnetic media writer to terminate the application of the write current to the write head after writing at least a portion of the magnet and prior to applying other write current to the write head to write another magnet.

3. The method of claim 2, wherein terminating the application of the write current comprises transitioning a pre-amplifier of the magnetic media writer to an off-state or a pre-bias voltage state prior to applying the other write current to the write head to write the other magnet.

4. The method of claim 1, wherein the inserting comprises inserting the at least one transition into the string of data bits at a predetermined bit location referenced from at least one of:

a last data bit in the string of data bits having the same polarity;

an end of the magnet to which the string of data bits corresponds; or a length of the magnet to which the string of data bits corresponds.

5. The method of claim 1, wherein the at least one transition comprises:

a first transition to the polarity opposite to the same polarity of the string of data bits; and a second transition subsequent to the first transition to the same polarity of the string of data bits.

6. The method of claim 1, wherein the at least one transition comprises a first set of one or more transitions, and the method further comprises:

deasserting, subsequent to the transmission of the first set of one or more transitions in the string of data bits, the signal to the magnetic media writer;

inserting, into the string of data bits, a second set of one or more transitions that includes a transition to the same polarity of the string of data bits; and transmitting, to the magnetic media writer, the string of data bits including the first set of one or more transitions and the second set of one or more transitions, the second set of one or more transitions causing the magnetic media writer to pulse the write current applied to the write head while writing the magnet corresponding to the string of data bits to the magnetic storage media.

7. The method of claim 1, wherein the string of data bits having a same polarity includes at least three bits of non-return-to-zero (NRZ) or at least three bits of non-return-to-zero inverted (NRZi) encoded data bits.

8. The method of claim 1, wherein the magnet length threshold is a predefined threshold associated with or based on a geometry of the write head; and the determining that the string of data bits corresponds to the magnet having the length that is longer than the magnet length threshold includes comparing a consecutive number of the data bits having the same polarity to the magnet length threshold.

9. An apparatus comprising:

an interface to receive data from a host;

a disk of magnetic storage media to store the data;

a magnetic media writer configured to write, via a write head of the magnetic media writer, the data to the magnetic storage media as respective magnets that correspond to data bits of the data; and a write current controller configured to:

determine that a string of the data bits having a same polarity corresponds to a magnet having a length that is longer than a magnet length threshold associated with the magnetic media writer;

assert, in response to the determination, a signal to the magnetic media writer to prevent the magnetic media writer from increasing write current applied to the write head in response to a transition in the string of data bits;

insert, into the string of data bits, at least one transition to a polarity opposite to the same polarity of the string of data bits; and transmit, to the magnetic media writer, the string of data bits including the at least one transition to cause the magnetic media writer to reduce an application of write current applied to the write head while writing the magnet corresponding to the string of data bits to the magnetic storage media.

10. The apparatus of claim 9, wherein the transmission of the string of data bits that includes the at least one transition causes the magnetic media writer to terminate the application of the write current to the write head after writing at least a portion of the magnet and prior to application of write current to the write head to write another magnet to the magnetic storage media.

11. The apparatus of claim 9, wherein the write current controller is further configured to:

insert the at least one transition into the string of data bits at a predetermined bit location referenced from at least one of:

a last data bit in the string of data bits having the same polarity;

an end of the magnet to which the string of data bits corresponds; or a length of the magnet to which the string of data bits corresponds.

12. The apparatus of claim 11, wherein the predetermined bit location in the string of data bits comprises:

at least four data bits from the last data bit in the string of data bits having the same polarity;

at least four magnet periods from the end of the magnet to which the string of data bits corresponds; or at least for magnet periods from a terminating point of the length of the magnet to which the string of data bits corresponds.

13. The apparatus of claim 9, wherein the at least one transition comprises a first set of one or more transitions, and the write current controller is further configured to:

deassert, subsequent to the transmission of the first set of one or more transitions in the string of data bits, the signal to the magnetic media writer;

insert, into the string of data bits, a second set of one or more transitions that includes a transition to the same polarity of the string of data bits; and transmit, to the magnetic media writer, the string of data bits including the first set of one or more transitions and the second set of one or more transitions, the second set of one or more transitions causing the magnetic media writer to pulse the write current applied to the write head while writing the magnet corresponding to the string of data bits to the magnetic storage media.

14. The apparatus of claim 13, wherein:

the application of the write current to the write head includes a baseline quantity of write current; and the pulse of write current applied to the write head comprises an overshoot quantity of write current that includes a sum of the baseline quantity of write current and another quantity of write current of a same polarity as the baseline quantity of write current.

15. The apparatus of claim 9, wherein:

the magnet length threshold is a predefined threshold associated with or based on a geometry of the write head; and to determine that the string of the data bits corresponds to the magnet having the length that is longer than the magnet length threshold, the write current controller is further configured to compare a consecutive number of the data bits having the same polarity to the magnet length threshold.

16. A System-on-Chip comprising:

an interface to a host from which data is received for writing to magnetic storage media;

an interface to a media writer of the magnetic storage media;

a write current controller implemented at least partially in hardware, the write current controller configured to:
  determine that a string of data bits having a same polarity corresponds to a magnet formed on the magnetic storage media has a length that is longer than a magnet length threshold associated with the media writer;
  assert, in response to the determination, a signal to the media writer to prevent the media writer from increasing write current to a write head of the media writer in response to a transition in the string of the data bits;
  insert, into the string of data bits, at least one transition to a polarity opposite to the same polarity of the string of data bits; and
  transmit, to the media writer, the string of data bits including the at least one transition to cause the media writer to reduce an application of write current applied to the write head while writing the magnet corresponding to the string of data bits to the magnetic storage media.

17. The System-on-Chip of claim 16, wherein the transmission of the string of data bits that includes the at least one transition causes the media writer to terminate the application of the write current to the write head after writing at least a portion of the magnet and prior to another application of write current to the write head to write another magnet.

18. The System-on-Chip of claim 17, wherein the write current controller is further configured to:
  insert the at least one transition into the string of data bits at a predetermined bit location referenced from at least one of:
    a last data bit in the string of data bits having the same polarity;
    an end of the magnet to which the string of data bits corresponds; or
    a length of the magnet to which the string of data bits corresponds.

19. The System-on-Chip of claim 16, wherein the at least one transition comprises a first set of one or more transitions, and the write current controller is further configured to:
  deassert, subsequent to the transmission of the first set of one or more transitions in the string of data bits, the signal to the media writer;
  insert, into the string of data bits, a second set of one or more transitions that includes a transition to the same polarity of the string of data bits; and
  transmit, to the media writer, the string of data bits including the first set of one or more transitions and the second set of one or more transitions, the second set of one or more transitions causing the media writer to pulse the write current applied to the write head while writing the magnet corresponding to the string of data bits to the magnetic storage media.

20. The System-on-Chip of claim 19, wherein:
  the application of the write current to the write head includes a baseline quantity of write current; and
  the pulse of write current applied to the write head comprises an overshoot quantity of write current that includes a sum of the baseline quantity of write current and another quantity of write current of a same polarity as the baseline quantity of write current.

* * * * *